United States Patent
Kim et al.

(10) Patent No.: US 11,903,183 B2
(45) Date of Patent: Feb. 13, 2024

(54) CONDUCTIVE LINE CONTACT REGIONS HAVING MULTIPLE MULTI-DIRECTION CONDUCTIVE LINES AND STAIRCASE CONDUCTIVE LINE CONTACT STRUCTURES FOR SEMICONDUCTOR DEVICES

(71) Applicant: Micron Technology, Inc., Boise, ID (US)

(72) Inventors: Byung Yoon Kim, Boise, ID (US); Sheng Wei Yang, Boise, ID (US); Si-Woo Lee, Boise, ID (US); Mark Zaleski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 536 days.

(21) Appl. No.: 17/060,457

(22) Filed: Oct. 1, 2020

(65) Prior Publication Data
US 2022/0108988 A1    Apr. 7, 2022

(51) Int. Cl.
*H01L 27/108*    (2006.01)
*H10B 12/00*    (2023.01)
(Continued)

(52) U.S. Cl.
CPC ............ *H10B 12/30* (2023.02); *G11C 5/025* (2013.01); *G11C 5/10* (2013.01); *H01L 27/0688* (2013.01); *H10B 12/02* (2023.02)

(58) Field of Classification Search
CPC ......... H01L 27/11597; H01L 27/11582; H01L 27/0688; H01L 23/5226; H01L 27/11556;
(Continued)

(56) References Cited

U.S. PATENT DOCUMENTS 10,607,995 B2    3/2020    Roberts et al.
2014/0008806 A1    1/2014    Ha et al.
(Continued)

OTHER PUBLICATIONS

International Search Report and Written Opinion from international patent application No. PCT/US2021/043466, dated Nov. 17, 2021, 12 pages.

(Continued)

*Primary Examiner* — Selim U Ahmed
(74) *Attorney, Agent, or Firm* — Brooks, Cameron & Huebsch, PLLC

(57) ABSTRACT

Systems, methods, and apparatus including conductive line contact regions having multiple multi-direction conductive lines and staircase conductive line contact structures for semiconductor devices. One memory device comprises arrays of vertically stacked memory cells, having multiple multi-direction conductive lines arrays of vertically stacked memory cells, including a vertical stack of layers formed from repeating iterations of a group of layers, the group of layers comprising: a first dielectric material layer, a semiconductor material layer, and a second dielectric material layer, the second dielectric material layer having a conductive line formed in a horizontal plane therein, and the vertical stack of layers having multiple multi-direction conductive lines in an interconnection region with a first portion of the interconnection region formed in an array region and a second portion formed in a conductive line contact region that is spaced from the array region.

22 Claims, 32 Drawing Sheets

(51) Int. Cl.
 *H01L 27/06* (2006.01)
 *G11C 5/02* (2006.01)
 *G11C 5/10* (2006.01)
(58) Field of Classification Search
 CPC ... H01L 29/40111; H01L 28/86; G11C 16/08; G11C 5/02; G11C 5/025; G11C 5/10; H10B 12/30; H10B 12/02; H10B 12/482; H10B 12/488; H10B 12/03; H10B 12/05
 See application file for complete search history.

(56) References Cited

U.S. PATENT DOCUMENTS

| | | |
|---|---|---|
| 2014/0241026 A1 | 8/2014 | Tanzawa |
| 2016/0027730 A1 | 1/2016 | Lee |
| 2016/0111136 A1 | 4/2016 | Chae |
| 2018/0145029 A1 | 5/2018 | Tanzawa |
| 2018/0323200 A1* | 11/2018 | Tang ............... H01L 23/528 |
| 2019/0103406 A1 | 4/2019 | Tang et al. |
| 2019/0164985 A1 | 5/2019 | Lee et al. |
| 2020/0066752 A1 | 2/2020 | Lee |
| 2020/0227418 A1 | 7/2020 | Kim et al. |

OTHER PUBLICATIONS

U.S. Appl. No. 16/204,224, entitled, "Memory Arrays," filed Nov. 29, 2018, 43 pages.

* cited by examiner

US 11,903,183 B2

CONDUCTIVE LINE CONTACT REGIONS HAVING MULTIPLE MULTI-DIRECTION CONDUCTIVE LINES AND STAIRCASE CONDUCTIVE LINE CONTACT STRUCTURES FOR SEMICONDUCTOR DEVICES

TECHNICAL FIELD

The present disclosure relates generally to memory devices, and more particularly, to conductive line contact regions having multiple multi-direction conductive lines and staircase conductive line contact structures for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device (e.g., a transistor) having a first and a second source/drain regions separated by a channel region. A gate may oppose the channel region and be separated therefrom by a gate dielectric. An access line, such as a world line, is electrically connected to the gate of the DRAM cell. A DRAM cell can include a storage node, such as a capacitor cell, coupled by the access device to a conductive line, such as a digit line. The access device can be activated (e.g., to select the cell) by an access line coupled to an access transistor. The capacitor can store a charge corresponding to a data value of a respective cell (e.g., a logic "1" or "0").

DETAILED DESCRIPTION

Figure 1:
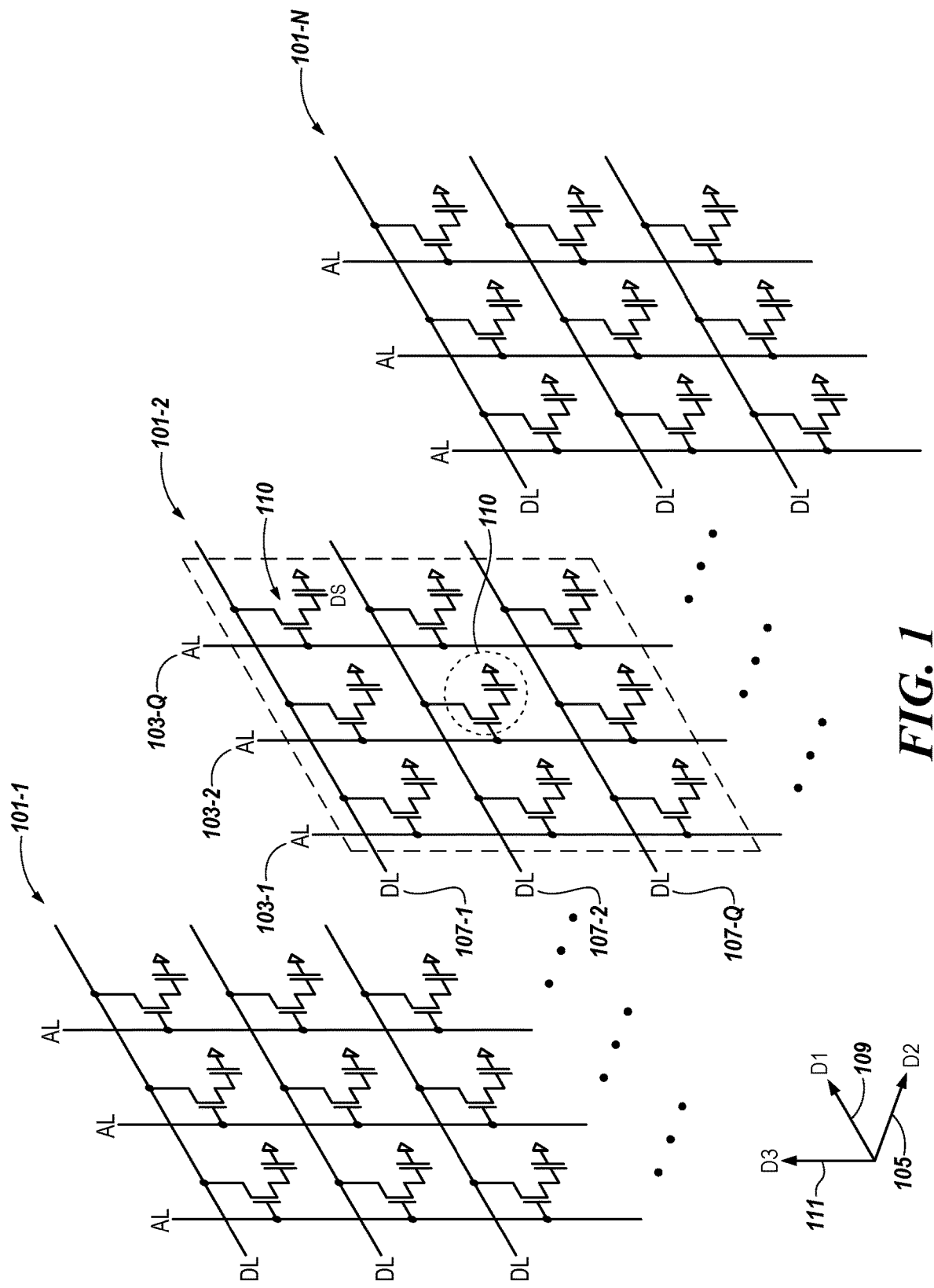
FIG. 1. is a schematic illustration of a vertical three dimensional (3D) memory device in accordance with a number of embodiments of the present disclosure.

Embodiments of the present disclosure describe conductive line contact regions having multiple multi-direction conductive lines and staircase conductive line contact structures for semiconductor devices. The conductive line contact regions having multiple multi-direction conductive lines and the staircase conductive line contact structures may be formed with horizontal access devices in an array of vertically stacked memory cells. As discussed herein, the horizontal access devices may be integrated with vertically oriented access lines and with horizontal digit lines. Although discussed herein as having vertically oriented access lines (e.g., word lines) and with horizontal digit lines, some embodiments may have vertically oriented digit lines and horizontal access lines with the access device being, for example, a word line driver, or other suitable access device. An advantage of the embodiments described herein is greater interconnection density as compared to conventional structures and processes, among other advantages.

In this manner, stacked memory devices, such as 3D DRAM devices, comprise multiple tiers of vertically stacked memory cells. Coupling the conductive lines (e.g., digit lines, word lines) of the 3D array to sense amplifiers or word line drivers can be challenging and can result in increased interconnection area size. For example, the traditional geometry of the conductive lines can result in a relatively large interconnection area associated with contacts used to connect the digit lines to the sense amplifiers. Various embodiments of the present disclosure can provide multi-direction conductive lines and can allow connection to those conductive lines through a tiered (e.g., staircase) structure. In some embodiments, the conductive lines may be digit lines coupled to one or more circuitry components (e.g., sense amplifiers) through an interconnection and/or sense amplifier contact. In other embodiments, the conductive lines may be access lines (i.e., world lines) coupled to one or more circuitry components (e.g. word line drivers). Embodiments of the present disclosure can provide benefits such as more density of connections between conductive lines and sense amplifiers in an interconnection area as compared to prior approaches.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302. The use of a letter, such as 302-N, means that any number of items 302 may be utilized.

FIG. 1 is a block diagram of an apparatus in accordance with a number of embodiments of the present disclosure. FIG. 1 illustrates a circuit diagram showing a cell array of a three dimensional (3D) semiconductor memory device according to embodiments of the present disclosure. FIG. 1 illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays (e.g., sub cell array 101-2) may include a plurality of access lines 103-1, 103-2, . . . , 103-Q (which also may be referred to as word lines). Also, each of the sub cell arrays (e.g., sub cell array 101-2) may include a plurality of digit lines 107-1, 107-2, . . . , 107-Q (which also may be referred to as bitlines, data lines, or sense lines). In FIG. 1, the digit lines 107-1, 107-2, . . . , 107-Q are illustrated extending in a first direction (D1) 109 and the access lines 103-1, 103-2, . . . , 103-Q are illustrated extending in a third direction (D3) 111.

The first direction (D1) 109 and the second direction (D2) 105 may be considered in a horizontal ("X-Y") plane. The third direction (D3) 111 may be considered in a vertical ("Z") direction (e.g., transverse to the X-Y plane). Hence, according to embodiments described herein, the access lines 103-1, 103-2, . . . , 103-Q are extending in a vertical direction (e.g., third direction (D3) 111).

A memory cell (e.g., 110) may include an access device (e.g., access transistor) and a storage node located at an intersection of each access line 103-1, 103-2, . . . , 103-Q and each digit line 107-1, 107-2, . . . , 107-Q. Memory cells may be written to, or read from, using the access lines 103-1, 103-2, . . . , 103-Q and digit lines 107-1, 107-2, . . . , 107-Q. The digit lines 107-1, 107-2, . . . , 107-Q may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-1, 101-2, . . . , 101-N. One memory cell, e.g., 110, may be located between one access line (e.g., 103-2) and one digit line (e.g., 107-2). Each memory cell may be uniquely addressed through a combination of an access line 103-1, 103-2, . . . , 103-Q and a digit line 107-1, 107-2, . . . , 107-Q.

The digit lines 107-1, 107-2, . . . , 107-Q may be or include conducting patterns (e.g., metal lines) disposed on and spaced apart from a substrate. The digit lines 107-1, 107-2, . . . , 107-Q may extend in a first direction (D1) 109. The digit lines 107-1, 107-2, . . . , 107-Q in one sub cell array (e.g., 101-2) may be spaced apart from each other in a vertical direction (e.g., in a third direction (D3) 111).

The access lines 103-1, 103-2, . . . , 103-Q may be or include conductive patterns (e.g., metal lines) extending in a vertical direction with respect to the substrate (e.g., in a third direction (D3) 111). The access lines in one sub cell array (e.g., 101-2) may be spaced apart from each other in the first direction (D1) 109.

A gate of a memory cell (e.g., memory cell 110) may be connected to an access line (e.g., 103-2) and a first conductive node (e.g., first source/drain region) of an access device (e.g., transistor) of the memory cell 110 may be connected to a digit line (e.g., 107-2). Each of the memory cells (e.g., memory cell 110) may be connected to a storage node (e.g., capacitor). A second conductive node (e.g., second source/drain region) of the access device (e.g., transistor) of the memory cell 110 may be connected to the storage node (e.g., capacitor). Storage nodes, such as capacitors, can be formed from ferroelectric and/or dielectric materials such as zirconium oxide ($ZrO_2$), hafnium oxide ($HfO_2$) oxide, lanthanum oxide ($La_2O_3$), lead zirconate titanate (PZT, Pb[Zr(x)Ti(1-x)]$O_3$), barium titanate ($BaTiO_3$), aluminum oxide (e.g., $Al_2O_3$), a combination of these with or without dopants, or other suitable materials.

While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 107-2) and the other may be connected to a storage node.

Figure 2:
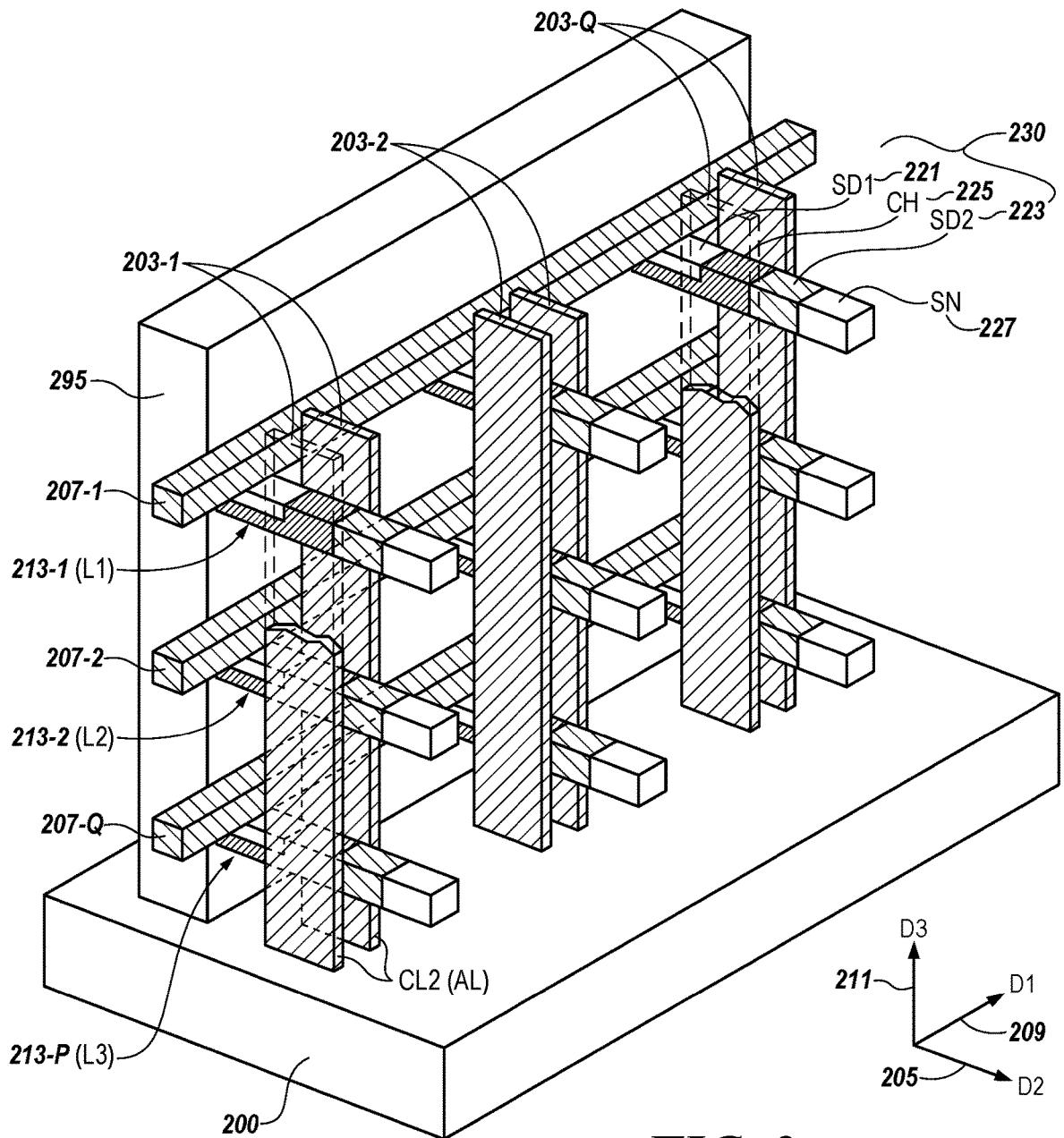
FIG. 2 is a perspective view illustrating a portion of a conductive line and staircase contact for semiconductor devices in accordance with a number of embodiments of the present disclosure.
Figure 3:
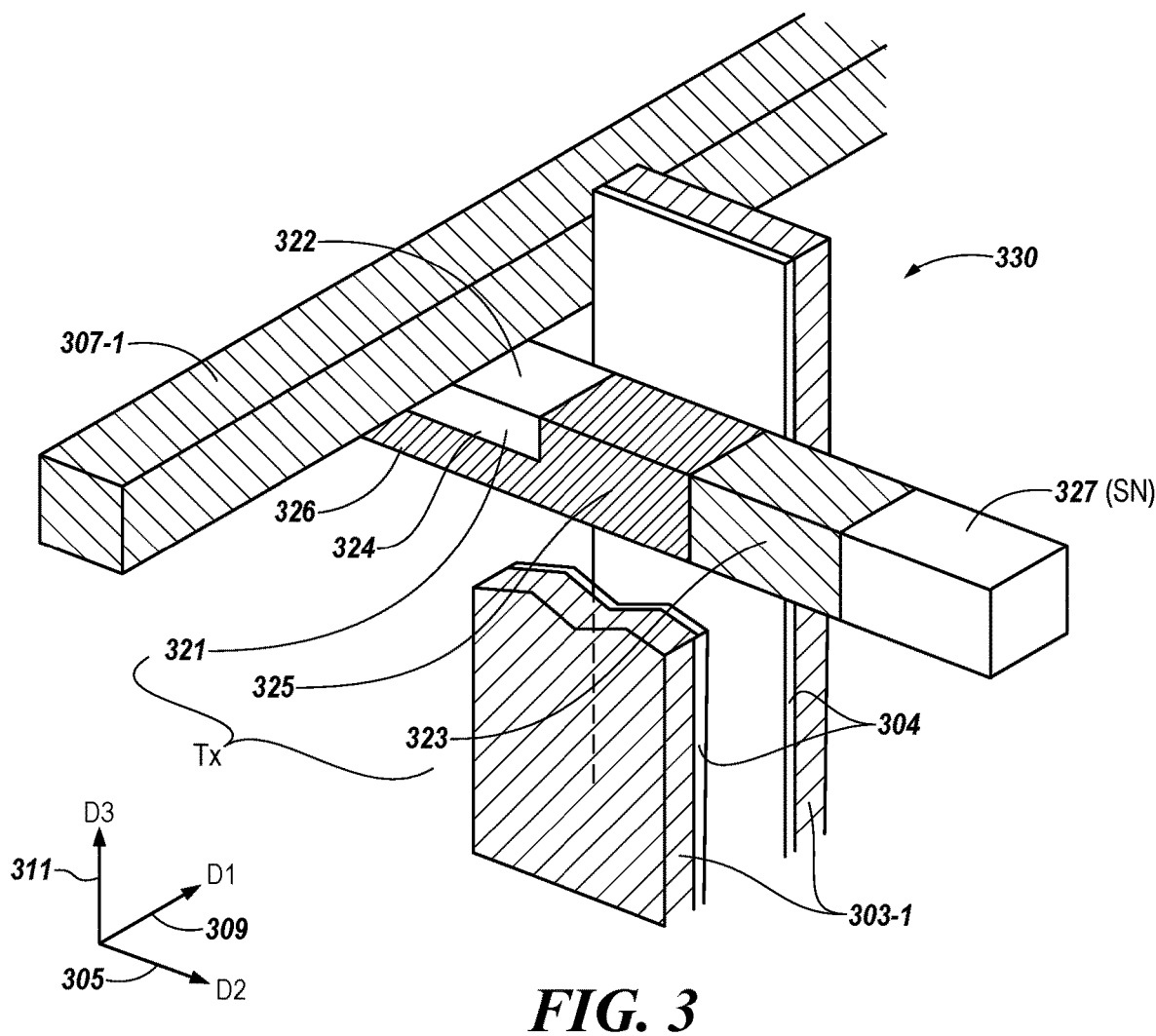
FIG. 3 is a perspective view illustrating a portion of a conductive line and staircase contact for semiconductor devices in accordance with a number of embodiments of the present disclosure.

FIG. 2 illustrates a perspective view showing a three dimensional (3D) semiconductor memory device (e.g., a portion of a sub cell array 101-2 shown in FIG. 1 as a vertically oriented stack of memory cells in an array) according to some embodiments of the present disclosure. FIG. 3 illustrates a perspective view showing unit cell (e.g., memory cell 110 shown in FIG. 1) of the 3D semiconductor memory device shown in FIG. 2.

As shown in FIG. 2, a substrate 200 may have formed thereon one of the plurality of sub cell arrays (e.g., 101-2) described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells (e.g., memory cell 110 in FIG. 1) extending in a vertical direction (e.g., third direction (D3) 111). According to some embodiments the vertically oriented stack of memory cells may be fabricated such that each memory cell (e.g., memory cell 110 in FIG. 1) is formed on plurality of vertical levels (e.g., a first level (L1), a second level (L2), and a third level (L3)). The repeating, vertical levels, L1, L2, and L3, may be arranged (e.g., "stacked") a vertical direction (e.g., third direction (D3) 111 shown in FIG. 1) and may be separated from the substrate 200 by an insulator material 220. Each of the repeating, vertical levels, L1, L2, and L3 may include a plurality of discrete components (e.g., regions) to the laterally oriented access devices 230 (e.g., transistors) and storage nodes (e.g., capacitors) including access line 103-1, 103-2, . . . , 103-Q connections and digit line 107-1, 107-2, . . . , 107-Q connections. The plurality of discrete components to the laterally oriented access devices 230 (e.g., transistors) may be formed in a plurality of iterations of vertically, repeating layers within each level, as described in more detail below in connection with FIGS. 4A-4K, and may extend horizontally in the second direction (D2) 205, analogous to second direction (D2) 105 shown in FIG. 1.

The plurality of discrete components to the laterally oriented access devices 230 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 110 in FIG. 1) may similarly extend in the second direction (D2) 205, analogous to second direction (D2) 105 shown in FIG. 1.

As shown in FIG. 2 a plurality of horizontally oriented digit lines 207-1, 207-2, . . . , 207-Q extend in the first direction (D1) 209, analogous to the first direction (D1) 109 in FIG. 1. The plurality of horizontally oriented digit lines 207-1, 207-2, . . . , 207-Q may be analogous to the digit lines 107-1, 107-2, . . . , 107-Q shown in FIG. 1. The plurality of horizontally oriented digit lines 207-1, 207-2, . . . , 207-Q may be arranged (e.g., "stacked") along the third direction (D3) 211. The plurality of horizontally oriented digit lines 207-1, 207-2, . . . , 207-Q may include a conductive material. For example, the conductive material may include one or more of a doped semiconductor (e.g., doped silicon, doped germanium, etc.) a conductive metal nitride (e.g., titanium nitride, tantalum nitride, etc.) a metal (e.g., tungsten (W), titanium (Ti), tantalum (Ta), ruthenium (Ru), cobalt (Co), molybdenum (Mo), etc.) and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontally oriented memory cells (e.g., memory cell 110 in FIG. 1) may be spaced apart from one another horizontally in the first direction (D1) 209. However, as described in more detail below in connection with the FIG. 4A, et seq., the plurality of discrete components to the laterally oriented access devices 230 (e.g., first source/drain region 221 and second source/drain region 223 separated by a channel region 225), extending laterally in the second direction (D2) 205, and the plurality of horizontally oriented digit lines 207-1, 207-2, . . . , 207-Q, extending laterally in the first direction (D1) 209, may be formed within different vertical layers within each level. For example, the plurality of horizontally oriented digit lines 207-1, 207-2, . . . , 207-Q, extending in the first direction (D1) 209, may be disposed on, and in electrical contact with, top surfaces of first source/drain regions 221 and orthogonal to laterally oriented access devices 230 (e.g., transistors) extending laterally in the second direction (D2) 205. In some embodiments, the plurality of horizontally oriented digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the laterally oriented access device are formed. In some embodiments, the plurality of horizontally oriented digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200 (e.g., in a third direction (D3) 211). Further, as shown in FIG. 2, the access lines, 203-1, 203-2, . . . , 203-Q, in one sub cell array (e.g., sub cell array 101-2 in FIG. 1) may be spaced apart from each other in the first direction (D1) 209. The access lines, 203-1, 203-2, . . . , 203-Q, may be provided, extending vertically relative to the substrate 200 in the third direction (D3) 211 between a pair of the laterally oriented access devices 230 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of laterally oriented access devices 230 (e.g., transistors) that are vertically stacked.

For example, and as shown in more detail in FIG. 3, a first one of the vertically extending access lines (e.g., 203-1) may be adjacent a sidewall of a channel region 225 to a first one of the laterally oriented access devices 230 (e.g., transistors) in the first level (L1) 213-1, a sidewall of a channel region 225 of a first one of the laterally oriented access devices 230 (e.g., transistors) in the second level (L2) 213-2, and a sidewall of a channel region 225 a first one of the laterally oriented access devices 230 (e.g., transistors) in the third level (L3) 213-P, etc. Similarly, a second one of the vertically extending access lines (e.g., 203-2) may be adjacent a sidewall to a channel region 225 of a second one of the laterally oriented access devices 230 (e.g., transistors) in the first level (L1) 213-1, spaced apart from the first one of laterally oriented access devices 230 (e.g., transistors) in the first level (L1) 213-1 in the first direction (D1) 209. And the second one of the vertically extending access lines (e.g., 203-2) may be adjacent a sidewall of a channel region 225 of a second one of the laterally oriented access devices 230 (e.g., transistors) in the second level (L2) 213-2, and a sidewall of a channel region 225 of a second one of the laterally oriented access devices 230 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 295 may be formed extending in the first direction (D1) 209 along an end surface of the laterally oriented access devices 230 (e.g., transistors) in each level (L1) 213-1, (L2) 213-2, and (L3) 213-P above the substrate 200. The body contact 295 may be connected to a body, as shown by 336 in FIG. 3, (e.g., body region) of the laterally oriented access devices 230 (e.g., transistors) in each memory cell (e.g., memory cell 110 in FIG. 1). The body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 110 in FIG. 1) of the vertically stacked array of memory cells (e.g., within a sub cell array 101-2 in FIG. 1) according to some embodiments of the present disclosure. As shown in FIG. 3, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2. The first and the second source/drain regions may be separated by a channel 325 formed in a body of semiconductor material (e.g., body region 326) of the laterally oriented access devices 330 (e.g., transistors). The first and the second source/drain regions, 321 and 323, may be formed from an n-type or p-type dopant doped in the body region 326. Embodiments are not so limited.

For example, for an n-type conductivity transistor construction, the body region 326 of the laterally oriented access devices 330 (e.g., transistors) may be formed of a low doped (p-) p-type semiconductor material. In some embodiments, the body region 326 and the channel 325 separating the first and the second source/drain regions, 321 and 323, may include a low doped, p-type (e.g., low dopant concentration (p-)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the laterally oriented access devices 330 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the laterally oriented access devices 330 (e.g., transistors). For example, the first source/drain region 321 may have a bottom surface 324 within the body 326 of the laterally oriented access device 330 which is located higher, vertically in the third direction (D3) 311, than a bottom surface of the body 326 of the laterally, horizontally oriented access device 330. As such, the laterally, horizontally oriented transistor 330 may have a body portion 326 which is below the first source/drain region 321 and is in electrical contact with the body contact (e.g., 295 shown in FIG. 2). Further, as shown in the example embodiment of FIG. 3, a digit line (e.g., 307-1) analogous to the digit lines 207-1, 207-2, . . . , 207-Q in FIGS. 2 and 107-1, 107-2, . . . , 107-Q shown in FIG. 1, may disposed on a top surface 322 of the first source/drain region 321 and electrically coupled thereto.

As shown in the example embodiment of FIG. 3, an access line (e.g., 303-1 analogous to the access lines 203-1, 203-2, . . . , 203-Q in FIGS. 2 and 103-1, 103-2, . . . , 103-Q in FIG. 1) may be vertically extending in the third direction (D3) 311 adjacent sidewall of the channel region 325 portion of the body 326 to the laterally oriented access devices 330 (e.g., transistors) horizontally conducting between the first and the second source/drain regions 321 and 323 along the second direction (D2) 305. A gate dielectric material 304 may be interposed between the access line 303-1 (a portion thereof forming a gate to the laterally oriented access devices 330 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figures 4A, 4B:
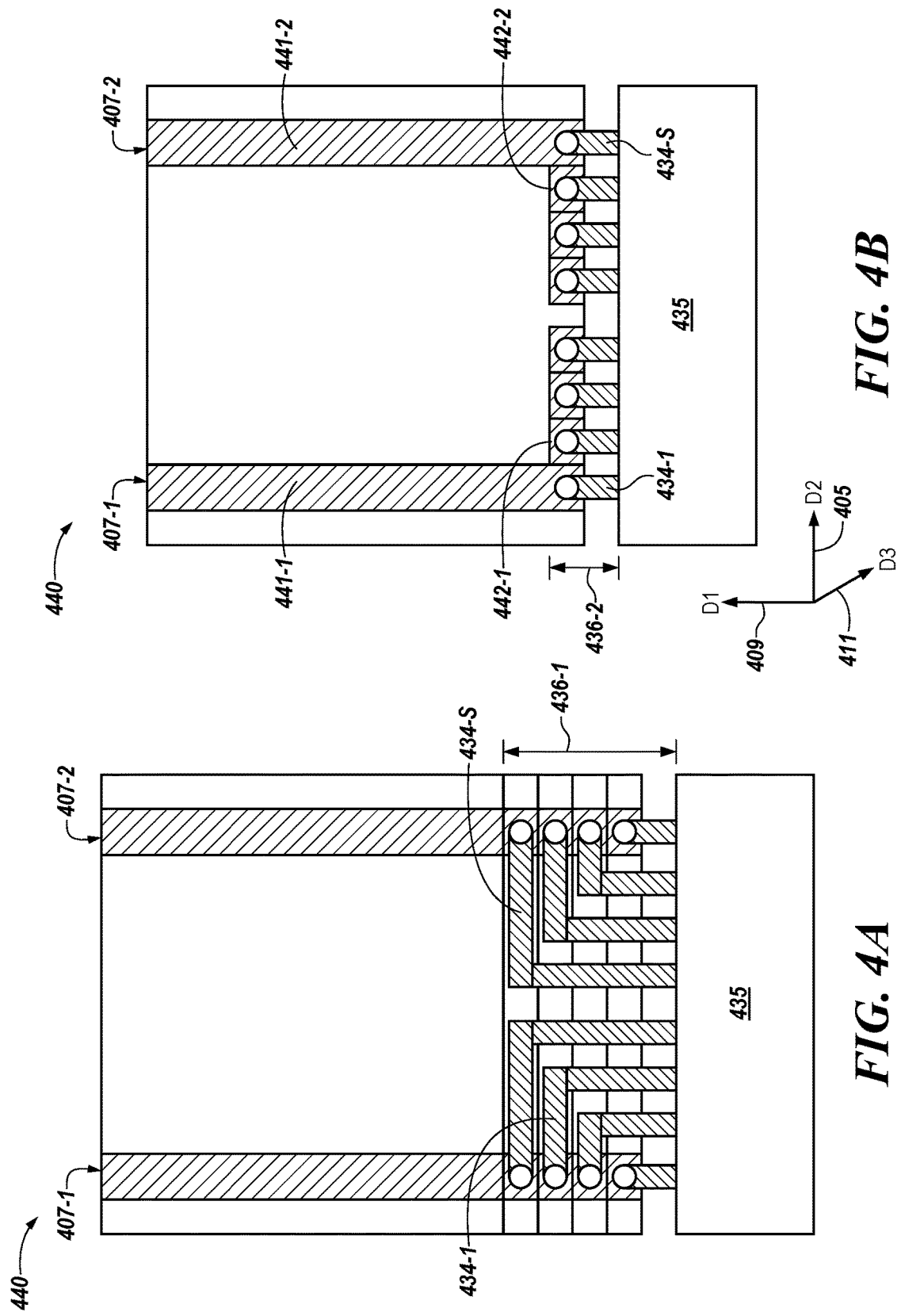
FIG. 4A is an overhead view illustrating a conventional memory device configuration.
FIG. 4B is an overhead view illustrating a memory device configuration in accordance with a number of embodiments of the present disclosure.

FIG. 4A is an overhead view illustrating a conventional three-dimensional (3D) memory device configuration. In such a configuration, a 3D DRAM array of vertically stacked memory cells 440 (i.e., a memory cell array) may have a number of digit lines (e.g., 407-1, . . . , 407-2) (referred to collectively as digit lines 407) formed therein. Each digit line may run in a first horizontal direction (D1) 409.

Each digit line may be coupled to one or more access devices (not shown). For example, in the embodiment illustrated in FIG. 4A, a 3D DRAM array of vertically stacked memory cells 440 has two digit lines 407 formed therein and running parallel to one another in direction (D1) 409, and each of the digit lines 407 within the array region is coupled to a sense amplifier positioned within sense amplifier region 435 via interconnections 434-1, . . . , 434-S.

The interconnections 434-1, . . . , 434-S may each include a first portion extending in the (D1) 409 direction and a second portion extending in a (D2) 405 direction, such that each second portion may be coupled to one of the digit lines 407 running in the (D1) 409 direction. This configuration of interconnections 434-1, . . . , 434-S and digit lines 407-1, . . . , 407-Q adds additional device space (illustrated at 436-1) to the memory cell array 440, which may be undesirable if spatial constraints apply. Further, it may be difficult to fabricate the L-shaped connectors that form interconnections 434-1, . . . , 434-S.

FIG. 4B is an overhead view illustrating a configuration of a memory device in accordance with one or more embodiments of the present disclosure. The structure illustrated in FIG. 4B can reduce the overall space occupied by each interconnection area and, thus, by the memory device. The memory device may include a 3D array of vertically stacked memory cells 440 (i.e., a memory cell array), a number of interconnections 434-1, . . . , 434-S, and a sense amplifier area 435 having a number of sense amplifiers. Each of the number of interconnections 434-1, . . . , 434-S may be electrically coupled to the sense amplifier 435.

The 3D array 440 of vertically stacked memory cells may include a vertical stack of horizontally oriented conductive lines (e.g., 407-1, 407-2). The conductive lines may be digit lines or access lines (i.e. word lines). Each conductive line 407 formed within the array 440 may include a first portion 441-1, . . . , 441-2 extending in a first horizontal direction (D1) 409. Each horizontal conductive line may further include a second portion 442-1, . . . , 442-T extending in a second horizontal direction D2, at an angle to the first horizontal direction (D1) 409. In other words, the memory cell array 440 may include a number of multi-direction conductive lines 407 (also referred to as bent conductive lines).

In some embodiments, the array of vertically stacked memory cells may, for example, be electrically coupled in an open digit line architecture. The array of vertically stacked memory cells can be electrically coupled in a folded digit line architecture, in other embodiments.

For example, as shown in FIG. 4B, in some embodiments, the second portion of each conductive line (e.g., 442-1, 442-2) may extend in a second horizontal direction (D2) 405 at an angle to the first portion (e.g., perpendicular to the first horizontal direction (D1) 409).

Although FIG. 4B illustrates conductive lines 407-1 and 407-2 having two portions 442-1 and 442-2, embodiments of the present disclosure are not so limited. For example, in some embodiments, each conductive line may further include a third portion extending in a third direction. The third portion may extend in direction (D1) 409. The third portion may be coupled to an end of a second portion. Such an embodiment is shown and discussed, for example in FIG. 5C below.

As illustrated in FIG. 4B, a memory device may further include a number of horizontally oriented interconnections 434-1, . . . , 434-S. In some embodiments, each horizontally oriented interconnection 434-1, . . . , 434-S may be electrically coupled to the second portion 442-1, 442-2 of a conductive line 407-1, 407-2. In some embodiments, each interconnection 434-1, . . . , 434-S may be coupled to a second portion 442-1, 442-2 of a conductive line 407-1, 407-2 through a horizontally oriented storage node. These horizontally oriented storage nodes may include capacitor cells.

Conductive lines 407-1, 407-2 may be coupled to sense amplifier region 435 through the interconnections 434-1, . . . , 434-S. In some embodiments, the conductive lines 407-1, 407-2 may be digit lines, and the sense amplifier region 435 may include of a number of sense amplifiers. Although not illustrated herein, in some embodiments, the conductive lines 407-1, 407-2 may be access lines (i.e., word lines), which may not be coupled to a sense amplifier region 435 but may instead be coupled to one or more other circuitry components (e.g., word line drivers) via contacts.

The multi-direction conductive line configuration illustrated in FIG. 4B can reduce spatial constraints by allowing the interconnections 434-1, . . . , 434-S to occupy less space (i.e., to take up space 436-2 which is less than space 436-1 of FIG. 4A). Coupling each interconnection 434-1, . . . , 434-S to a second portion 442-1, 442-2 of each conductive line 407-1, 407-2 as illustrated in FIG. 4B can reduce the overall space occupied by a conventional memory device as illustrated in FIG. 4A.

Although not illustrated in FIG. 4B, the 3D array 440 may include a plurality of vertical levels, which may also be referred to as a plurality of groups of layers. Each vertical level may include one or more layers with one or more horizontal conductive lines 407 formed therein.

In some embodiments, each second portion 442-1, . . . , 442-T of each conductive line 407 may be of a length greater than the second portion 442-1, . . . , 442-T of a conductive line 407 on a lower vertical level. Thus, if the 3D array is comprised of levels L1, L2, . . . , LN and L1 is the top level of the vertical stack, the length of the second portions of the conductive lines of L1 may be less than the length of the second portions of the conductive lines of L2, . . . , LN. For example, given that FIG. 4B is an overhead view, the conductive lines 407-1 and 407-2 illustrated in FIG. 4B may be formed on a top level L1 of the vertical 3D array 440. Thus, the conductive lines 407-1 and 407-2 may each include a second portion 442-1 and 442-2 of a length less than the second portions of each conductive line on the lower levels of the 3D array 440.

Figure 4C:
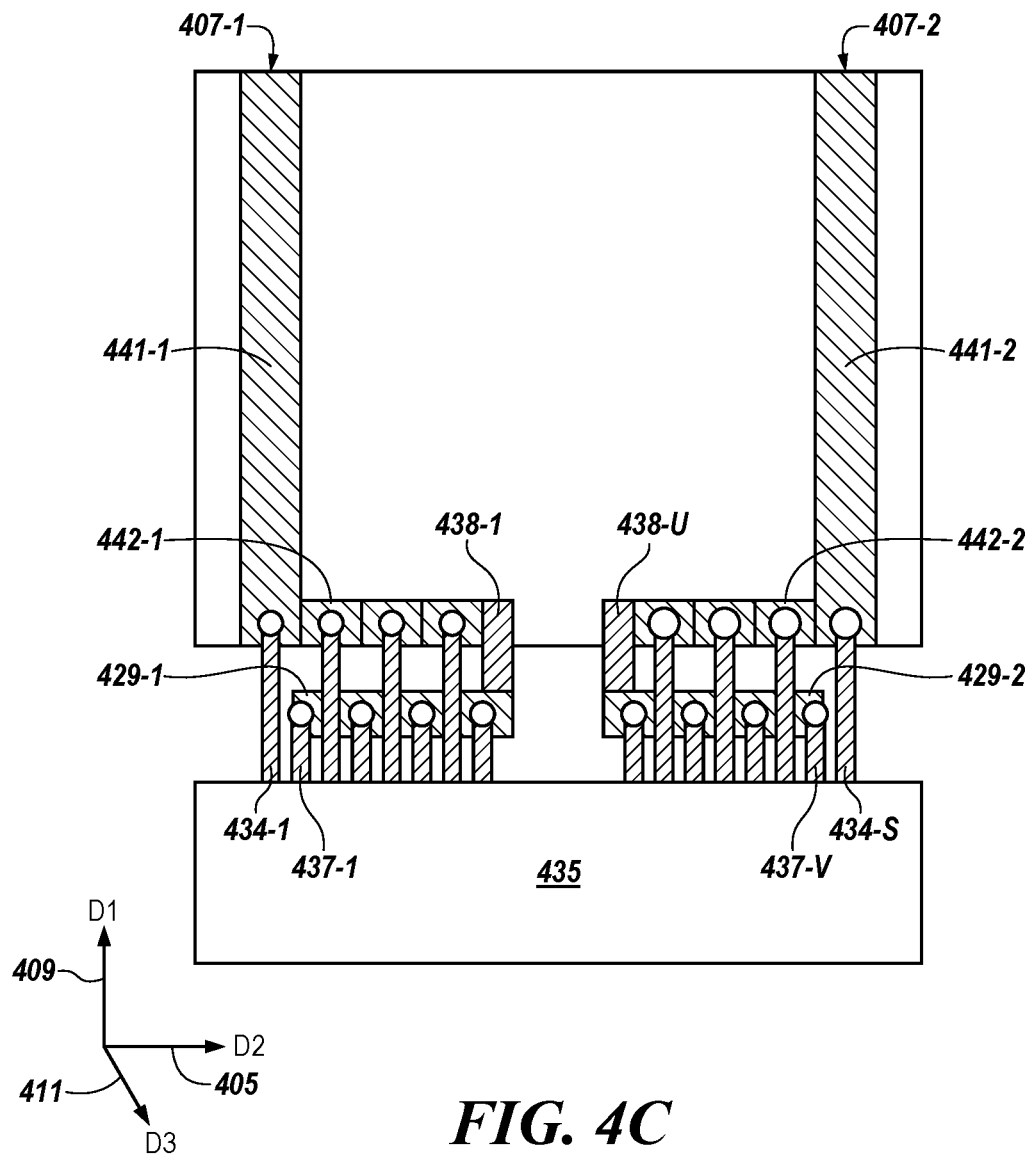
FIG. 4C is an overhead view illustrating another memory device configuration in accordance with a number of embodiments of the present disclosure.

FIG. 4C also includes conductive line portions 438-1, . . . , 438-U oriented in the first horizontal direction (D1) 409 and a fourth portion 429 extending in a horizontal direction (D2) 405 that is at an angle to the first horizontal direction (D1) 409 and is coupled to a sense amplifier positioned within sense amplifier region 435 one or more other circuitry components via interconnections 437-1, . . . , 437-V.

For example, in the embodiment shown in FIG. 4C, the third portion is in the first direction and the fourth portion is in the same direction as the second portion. This creates a cascading arrangement that allows for many more connections than in the embodiments of FIGS. 4A and 4B. As will be seen below, the cascading structure can be extended to include more portions, thereby allowing the structure to allow for even more connections than shown in the embodiment illustrated in FIG. 4C.

Additionally, although the first and second and third and fourth portions are shown as being perpendicular to each other, they may be at any suitable angle for accomplishing the cascading ability discussed herein. Also, although the first and third and second and fourth portions are shown as being parallel to each other, they may be at any suitable angle for accomplishing the cascading ability discussed herein.

Figure 5A:
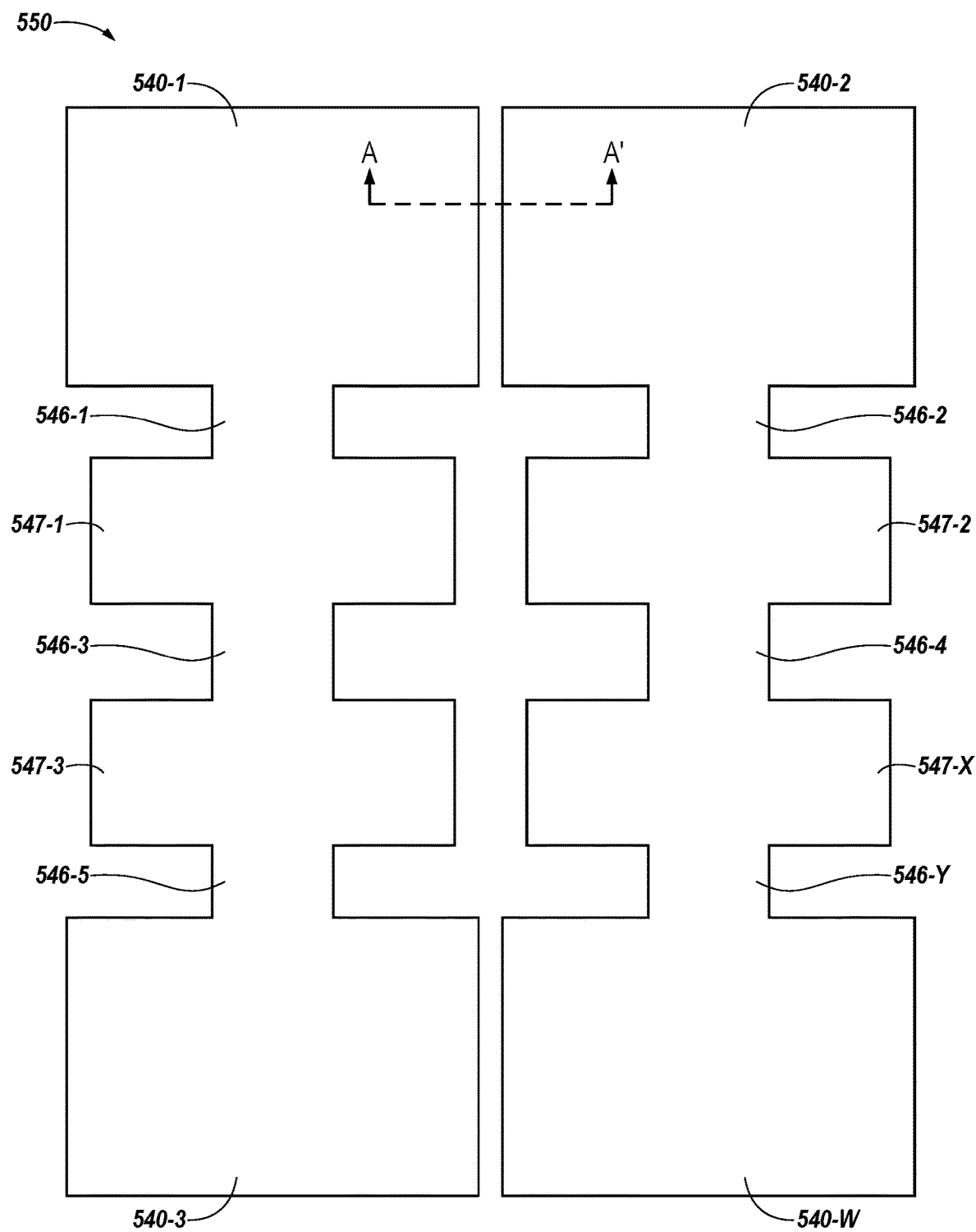
FIGS. 5A-5T illustrate an example method for forming arrays of vertically stacked memory cells having conductive line contact regions having multiple multi-direction conductive lines and staircase conductive line contact structures in accordance with one or more embodiments of the present disclosure.

FIGS. 5A-5U illustrate an example method for forming arrays of vertically stacked memory cells in accordance with one or more embodiments of the present disclosure. FIG. 5A is an overhead view illustrating a memory device configuration in accordance with a number of embodiments of the present disclosure.

As illustrated, a memory device may include a number of 3D array regions 540-1, ..., 540-W (i.e., a number of memory cell arrays). Each of these array regions 540-1, ..., 540-W includes vertically stacked memory cells (e.g., memory cell 110 of FIG. 1). The number of memory cell array regions 540-1, ..., 540-W may be positioned in a configuration to form an array 550. During formation, each of the memory cell array regions 540-1, ..., 540-W may be temporarily coupled to an adjacent array region of regions 540-1, ..., 540-W in the same column through one or more bridges 546 (e.g., 546-1, ..., 546-Y), and one or more conductive line contact regions 547 (e.g., digit line contact regions 547-1, ..., 547-X) as shown in FIG. 5A. This coupling will be severed later in the process, creating a single array having one or more bridges and conductive line contact areas.

Figure 5B:
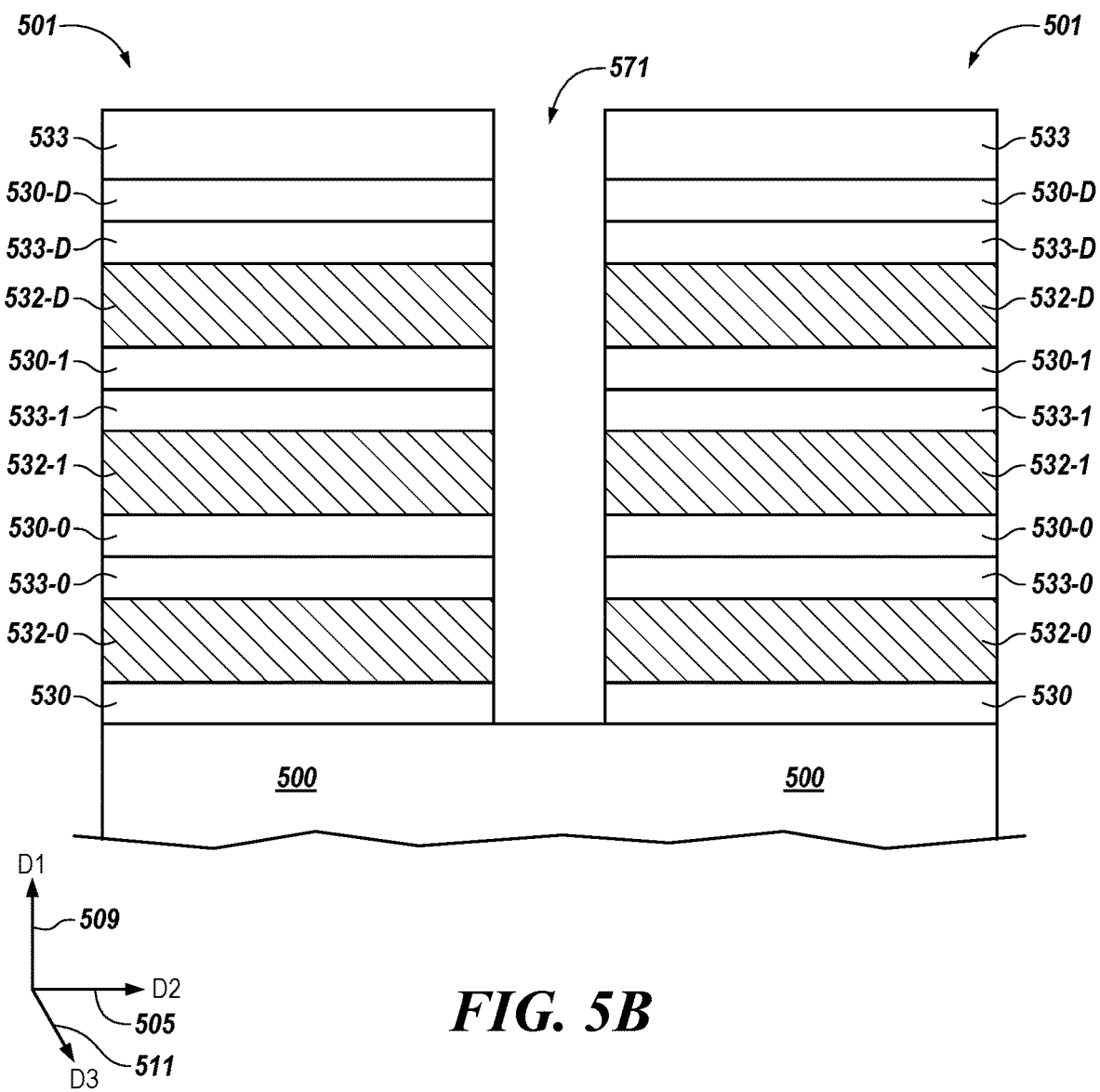

FIG. 5B is a cross-sectional view along line A-A' of FIG. 5A illustrating a stage of a process for forming conductive line contact regions having multiple multi-direction conductive lines and the staircase conductive line contact structures for semiconductor devices, such as illustrated in FIGS. 1-3, and in accordance with one or more embodiments of the present disclosure. As illustrated in FIG. 5B, the method includes forming alternating layers of a first dielectric material, 530-0, 530-1, ..., 530-D (collectively referred to as first dielectric material 530), a semiconductor material, 532-0, 532-1, ..., 532-D (collectively referred to as semiconductor material 532), and a second dielectric material, 533-0, 533-1, ..., 533-D (collectively referred to as second dielectric material 533), in repeating iterations to form a vertical stack 501 on a working surface of a substrate 500, analogous to substrate 200 in FIG. 2. In some embodiments, the method may further include depositing a top layer of the first dielectric material 530 and a top layer of the second dielectric material 533 above the alternating layers. As shown in FIG. 5B, a horizontal direction is illustrated as a first horizontal direction (D3) (e.g., Y-direction in an X-Y-Z coordinate system) analogous to the first direction (D2), among first, second, and third directions, shown in FIGS. 4A-4C. A second horizontal direction (D3) is also illustrated in FIG. 5B (e.g., X-direction in an X-Y-Z coordinate system) analogous to the second horizontal direction (D3) shown in FIGS. 4A-4C. A vertical direction (D1) (e.g., Z-direction in an X-Y-Z coordinate system) is also illustrated in FIG. 5B and is analogous to the vertical direction (D1) shown in FIGS. 4A-4C.

In some embodiments, the first dielectric material may be an interlayer dielectric (ILD). By way of example, and not by way of limitation, the first dielectric material may include a silicon nitride ($Si_3N_4$) material (also referred to herein as ("SiN"). In another example, the first dielectric material may include a silicon oxy-carbide material ($SiO_xN_y$) material (also referred to herein as "SiON"), and/or combinations thereof. Embodiments are not limited to these examples.

In some embodiments, the semiconductor material may include a silicon material. The semiconductor material may be in a polycrystalline and/or amorphous state. The semiconductor material may, for example, be a low doped, p-type (p-) silicon material. The semiconductor material may, for instance, be formed by gas phase doping boron atoms (B), as an impurity dopant, at a low concentration to form the low doped, p type (p-) silicon material. In some embodiments, the low doped, p-type (p-) silicon material may be a polysilicon material. Embodiments, however, are not limited to these examples.

In some embodiments, the second dielectric material may be an interlayer dielectric (ILD). By way of example, and not by way of limitation, the second dielectric material may include a nitride material. The nitride material may be a silicon nitride ($Si_xN_4$) material (also referred to herein as ("SiN").

In another example, the second dielectric material, 533-0, 533-1, ..., 533-D, may include a silicon oxy-carbide (SiOC) material. In another example, the second dielectric material may include silicon oxy-nitride (SiON), and/or combinations thereof. Embodiments are not limited to these examples. However, according to some embodiments, the second dielectric material can be purposefully chosen to be different in material or composition than the first dielectric material, such that a selective etch process may be performed on one of the first and second dielectric layers, selective to the other one of the first and second dielectric layers, (e.g., the second SiN dielectric material may be selectively etched relative to the semiconductor material.

The repeating iterations of alternating first dielectric material, 530-0, 530-1, ..., 530-D layers, semiconductor material, 532-0, 532-1, ..., 532-D layers, and second dielectric material, 533-0, 533-1, ..., 533-D layers may be deposited according to a semiconductor fabrication process such as chemical vapor deposition (CVD) in a semiconductor fabrication apparatus. Embodiments, however, are not limited to this example, and other suitable fabrication techniques may be used to deposit the alternating layers of a first dielectric material, a semiconductor material, and a second dielectric material, in repeating iterations to form the vertical stack 501.

In the example of FIG. 5B, three levels of the repeating iterations are shown. For example, the stack may include: a first dielectric material 530-1, a semiconductor material 532-1, a second dielectric material 533-1, a third dielectric material 530-2, a second semiconductor material 532-2, a fourth dielectric material 533-2, a fifth dielectric material 530-3, a third semiconductor material 532-3, and a sixth dielectric material 533-3. As such, a stack may include: a first oxide material 530-1, a first semiconductor material 532-1, a first nitride material 533-1, a second oxide material 530-2, a second semiconductor material 532-2, a second nitride material 533-2, a third oxide material 530-D, a third semiconductor material 532-D, and a third nitride material 533-D in further repeating iterations. Embodiments, however, are not limited to this example, and more or fewer repeating iterations may be included.

It should be noted by the reader that, although not illustrated in FIG. 5A or FIG. 5B, a number of trenches may be formed between rows of interconnections of the memory cell array. The number of trenches may be configured such that conductive lines may be formed therein. Conductive lines formed in these trenches may be referred to as "undercut" or "buried" conductive lines.

Figure 5C:
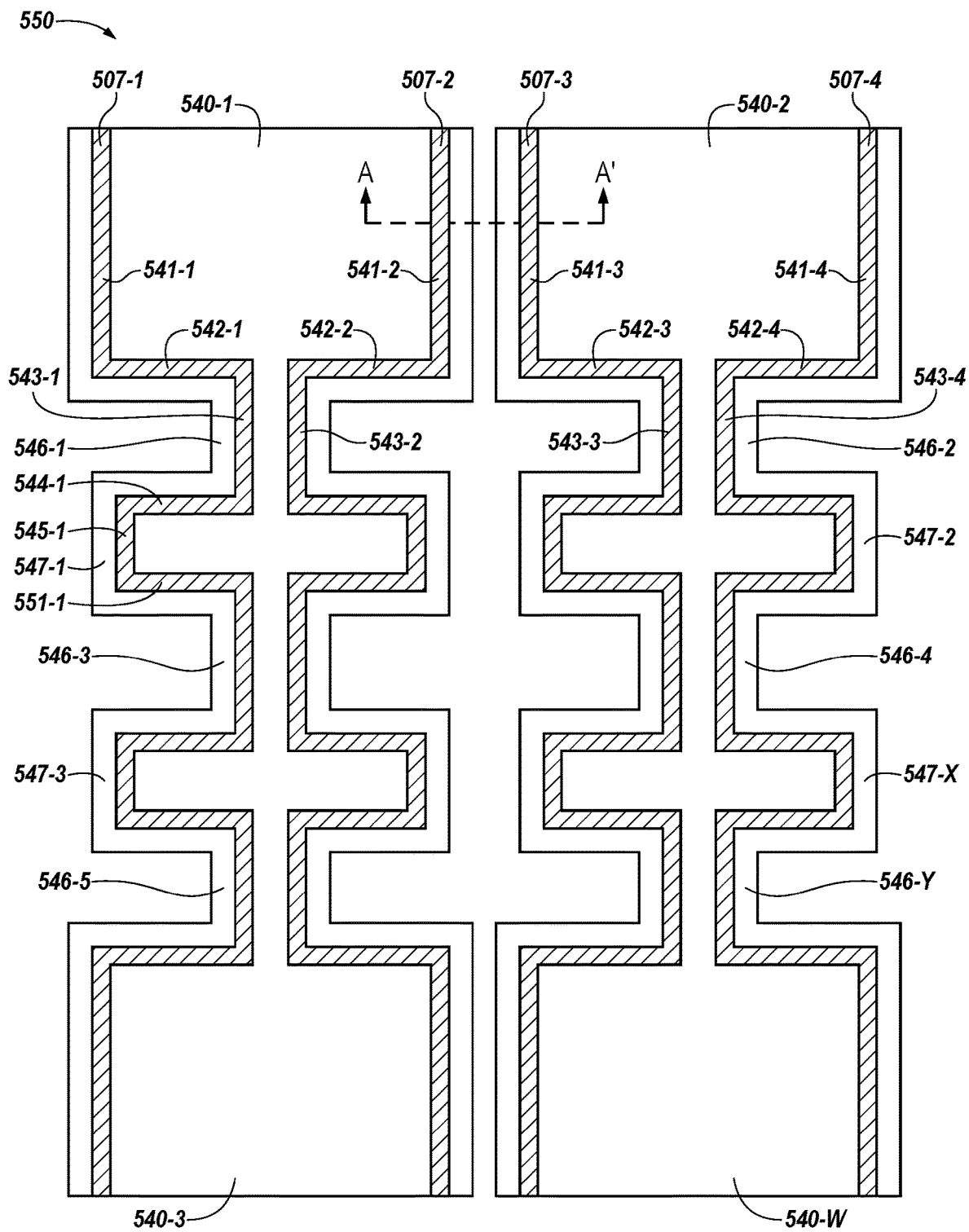

FIG. 5C is an overhead view of another stage of a method for forming arrays of vertically stacked memory cells with horizontally oriented digit lines and vertically oriented access lines. As shown in FIG. 5C, conductive lines 507-1, ..., 507-4 may be formed within the second dielectric (e.g., 533-0, 533-1, ..., 533-D, in FIG. 5B). The conductive lines in the present disclosure include portions (e.g., 541-1, 542-1, 543-1, 544-1, 545-1, 551-1 and 541-2, 542-2, 543-2, 544-2, 545-2, 551-2) that are at angles to each other, such as when they progress through the array regions 540-1, ..., 540-W, bridges 546-1, ..., 546-Y, and conductive line contact regions 547-1, ..., 547-X, as shown in FIG. 5C. These conductive lines 507-1, ..., 507-4 may, for example, be aligned with the edge of a perimeter of the array regions, bridges, and/or conductive line contact regions (i.e., running generally parallel to an edge of the array region 540, bridge 546, or conductive line contact region 547, as shown). In some embodiments, the conductive lines may be in an undercut or buried formation.

Figure 5D:
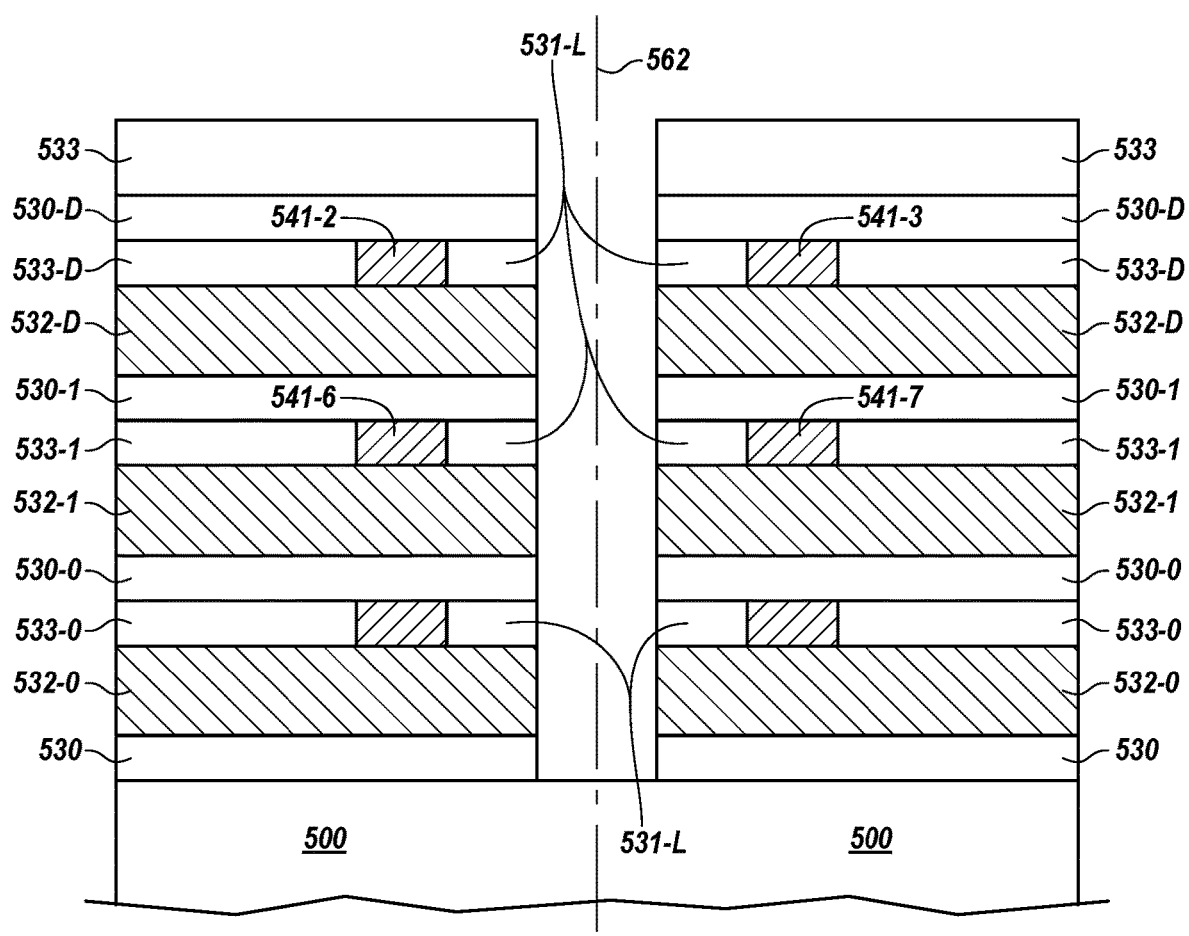

FIG. 5D is a cross-sectional view, along line A-A' of FIG. 5C, illustrating a stage of a method for forming conductive line contact regions having multiple multi-direction conductive lines and the staircase conductive line contact structures for semiconductor devices, such as illustrated in FIGS. 1-3, and in accordance with a number of embodiments of the present disclosure.

In some embodiments, conductive lines may be formed within the one or more layers of the second dielectric material 533-0, 533-1, . . . , 533-D of the stack. This may be achieved through a conductive line formation process including, for example, selectively removing the second dielectric material 533-0, 533-1, . . . , 533-D (e.g., to form a first horizontal opening by removing the second dielectric material to a first distance back from a reference line 562 (e.g., a center line in vertical opening between memory cell stacks 501).

The conductive line formation process may further include depositing a conductive material into the vertical opening. In some embodiments, this may include conformally depositing the conductive material into a portion of the vertical opening (e.g., using a chemical vapor deposition (CVD) process) such that the conductive material may also be deposited into the first horizontal opening. In some embodiments, the conductive material may include a titanium nitride (TiN) material. The conductive material may form a horizontally (e.g., laterally) oriented digit line.

The conductive material may then be recessed back in the horizontal opening (e.g., etched away from the vertical opening using reactive ion etching or other suitable techniques). In some examples, the conductive material may be removed back in the horizontal opening a second distance from the vertical opening, to form the digit line. The conductive material may be selectively etched, leaving the dielectric material 530, a portion of the conductive material, and the semiconductor material 532 intact. The conductive material may be etched to define the desired conductive line width. In some embodiments, the conductive material may be etched using an atomic layer etching (ALE) process. In some embodiments, the conductive material may be etched using an isotropic etch process.

As such, the conductive material may be selectively removed a second distance back from the vertical opening, forming a smaller horizontal opening between the first dielectric 530-0, . . . , 530-D and semiconductor 532-0, . . . , 532-D layers. A third dielectric 531-L may then be deposited into each of the horizontal openings laterally adjacent to the conductive material. In some embodiments, the third dielectric material 531-L may be identical or similar to the second dielectric material 533. For example, in some embodiments, the second dielectric material and third dielectric material may each include a nitride material.

The third dielectric material 531-L may be recessed back to a second distance from the reference line 562 to remove it from the first vertical opening and maintain the first vertical opening to allow for deposition of a conductive material to form a direct, electrical contact between such conductive material deposited within the vertical opening and the low doped semiconductor material 532-0, . . . , 532-D (e.g., body region contact) of the horizontally oriented interconnection (e.g., access device) (not pictured in FIG. 5D) within the memory cell array region 540. In some embodiments, the third dielectric material 531-L may be removed away from the vertical opening to expose the sidewalls of the first dielectric material 530-0, . . . , 530-D, the third dielectric material 531-L, and the semiconductor material 532-0, . . . , 532-D.

Figure 5E:
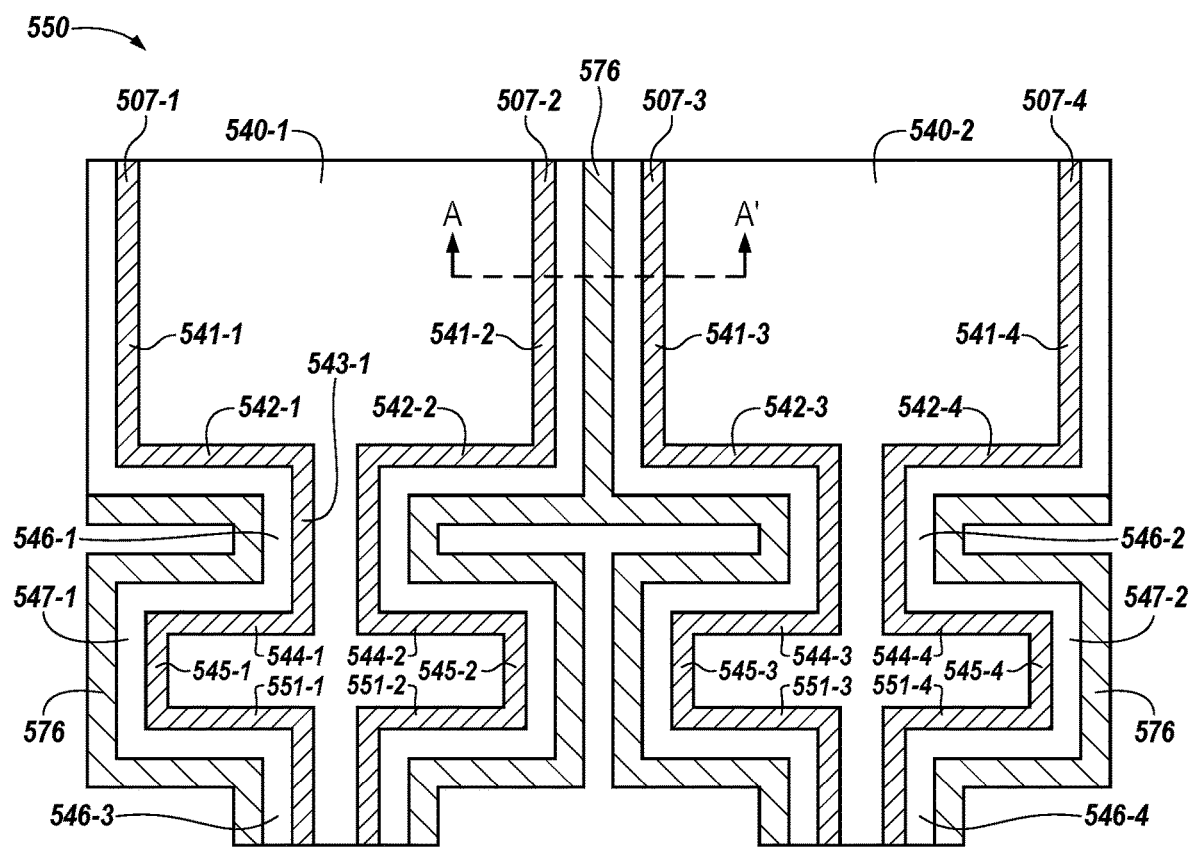

FIG. 5E is an overhead view of another stage of a method for forming conductive line contact regions having multiple multi-direction conductive lines and the staircase conductive line contact structures for semiconductor devices, in accordance with one or more embodiments of the present disclosure. For simplicity, FIG. 5E illustrates the top half of the memory cell structure (e.g., shown in FIG. 5C), however, the description of the method described with respect to FIG. 5E can be applied to those elements in the bottom half of the memory cell structure as well.

Such a method may include depositing a conductive material 576 (e.g., polysilicon) over, around, or between the one or more memory cell regions 540-1, . . . , 540-W, bridges 546-1, . . . , 546-Y, and digit line contact regions 547, . . . , 547-X, for example, for body bias control during this part of the formation process. The conductive material 576 may include, for example, a conductive polymer material. In some embodiments, the conductive material 576 may form a doped body contact to the number of interconnections described in connection with FIG. 4B. The conductive material 576 can also be etched back as appropriate.

Although FIG. 5E only illustrates two memory cell regions 540-1 and 540-2, embodiments of the present disclosure are not so limited. For example, a conductive material 576 may be deposited between or around a group of memory cell array regions of an array (e.g., four cell array 550 illustrated in FIGS. 5A and 5C), among other arrangements of cell arrays.

Figure 5F:
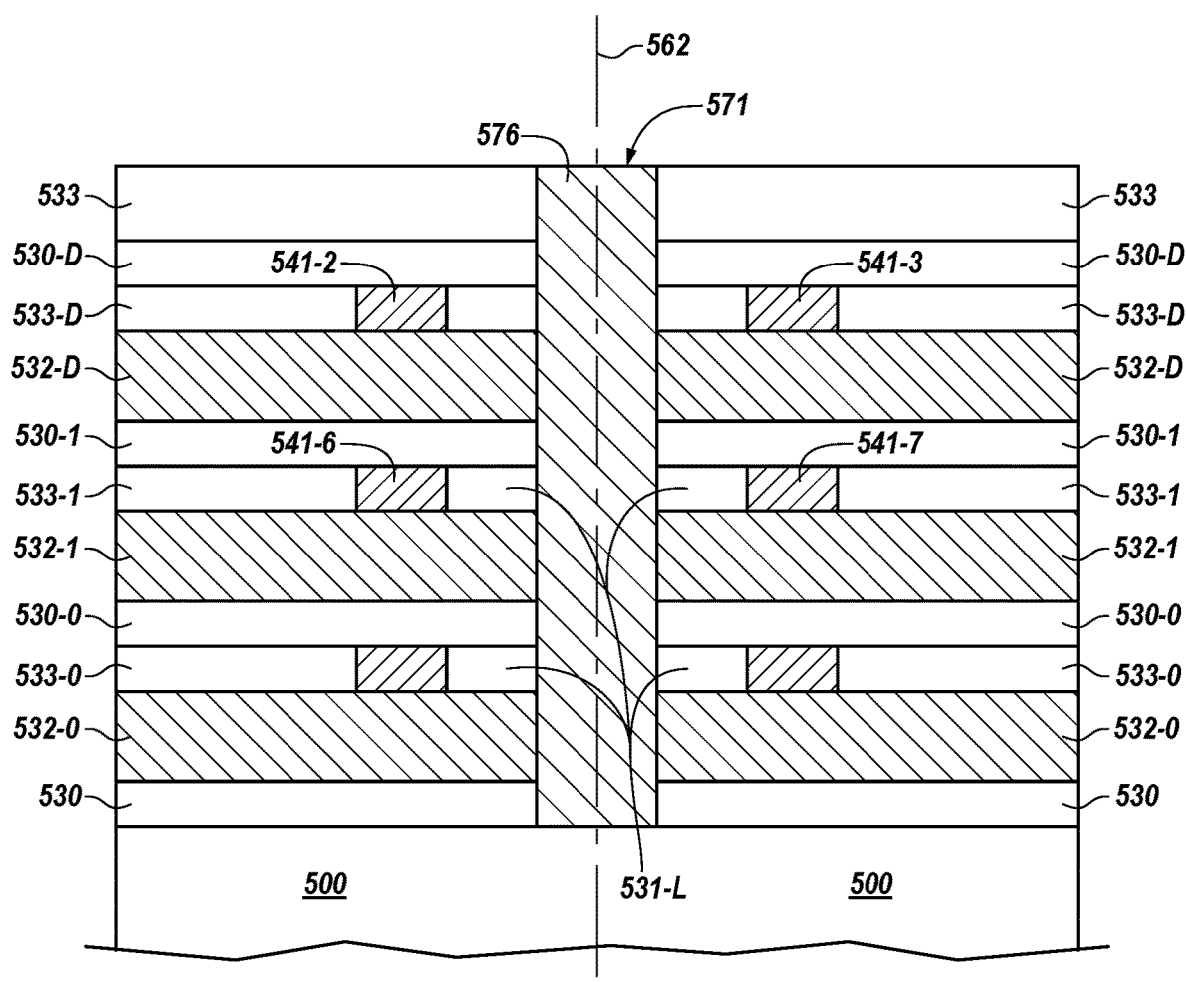

FIG. 5F is a cross-sectional view of line A-A' in FIG. 5E, which is analogous to line A-A' in FIG. 5C and line A-A' in FIG. 5A. As shown in FIG. 5F, the vertical opening 571 between the memory cell array regions (e.g., 540-1 and 540-2 in FIG. 5E) may be filled with the conductive material 576 as a result of the process described in connection with FIG. 5E.

Figure 5G:
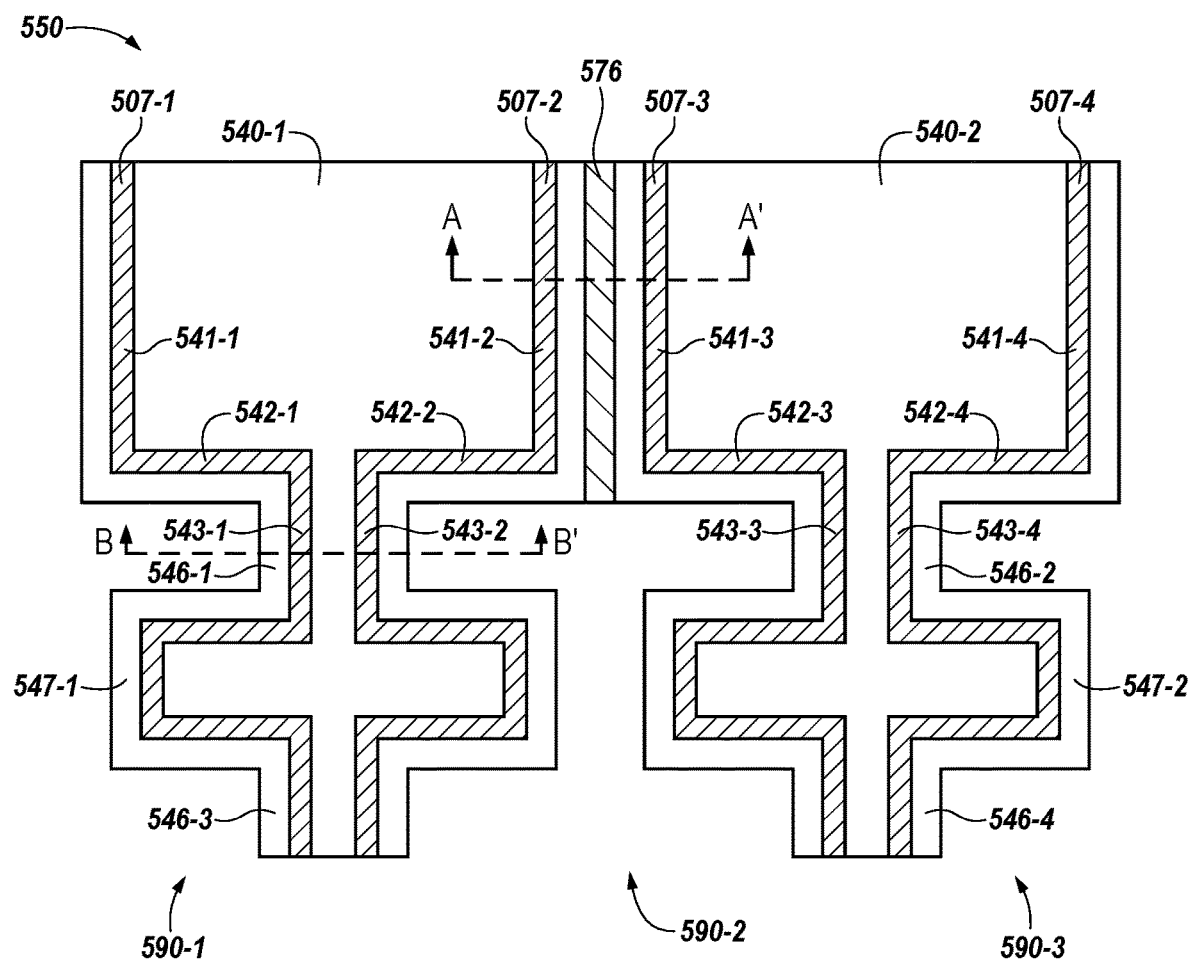

FIG. 5G is an overhead view of another stage of a method for forming conductive line contact regions having multiple multi-direction conductive lines and the staircase conductive line contact structures for semiconductor devices, in accordance with one or more embodiments of the present disclosure. As shown in FIG. 5G, the conductive material 576 may be partially removed from regions 590 (e.g., 590-1, . . . , 590-3). Although not shown in FIG. 5G, a mask (e.g., a photoresist layer) may be deposited over regions 590 before the conductive material 576 is removed.

Figure 5H:
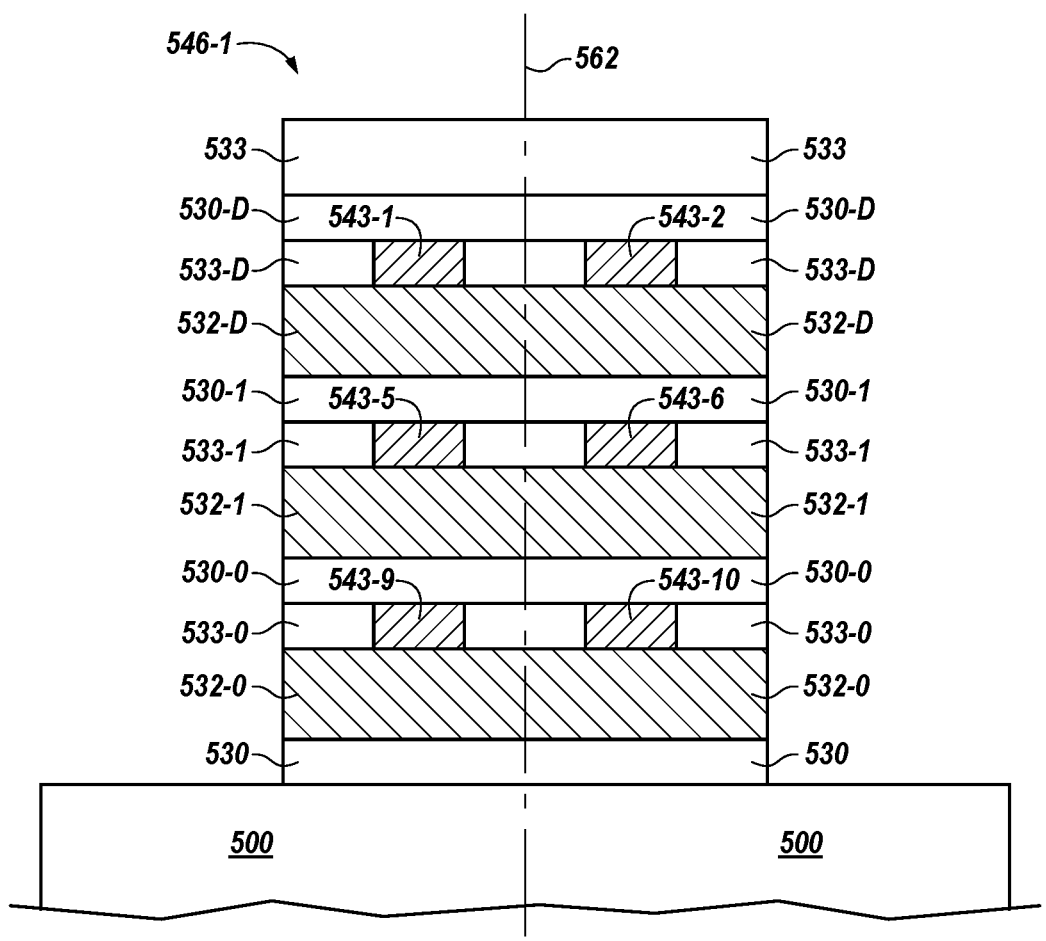

FIG. 5H is a cross-sectional view along line B-B' of FIG. 5G after the processes described in connection with FIG. 5G has been performed. FIG. 5H illustrates portions 543-1 and 543-2 of conductive lines 507-1 and 507-2 of FIG. 5G already formed at this stage. However, embodiments of the present disclosure are not so limited. For example, in some embodiments, the areas of conductive lines illustrated in FIG. 5H may include empty trenches, and those trenches may be filled with a conductive material at a later stage to form conductive lines. FIG. 5H also identifies conductive line portions 543-5 and 543-6 and portions 543-9 and 543-10 of digit lines formed below conductive lines 507-1 and 507-2 shown in FIG. 5G.

Figure 5I:
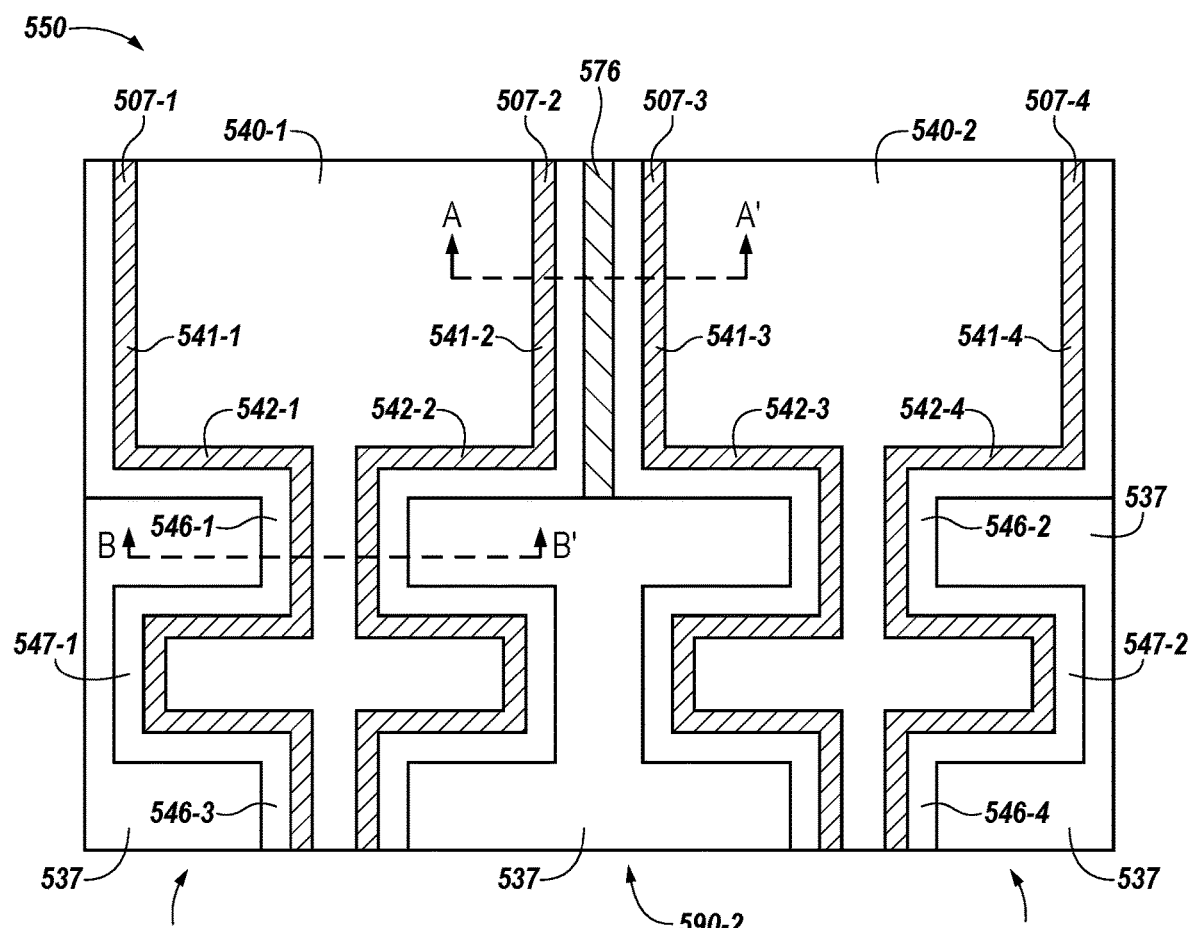

FIG. 5I is an overhead view of another stage of a method for forming conductive line contact regions having multiple multi-direction conductive lines and the staircase conductive line contact structures for semiconductor devices, in accordance with one or more embodiments of the present disclosure. As shown in FIG. 5I, a fourth dielectric material 537 (e.g., a spin on dielectric) may be deposited into regions 590 around and between bridges 546-1, 546-2, 546-3, 546-4 and digit line contact regions 547-1 and 547-2. In some embodiments, the fourth dielectric material 537 may be similar or identical to the first dielectric material 530. For example, in some embodiments, the first dielectric material 530 and the fourth dielectric material 537 may each include an oxide material.

Figure 5J:
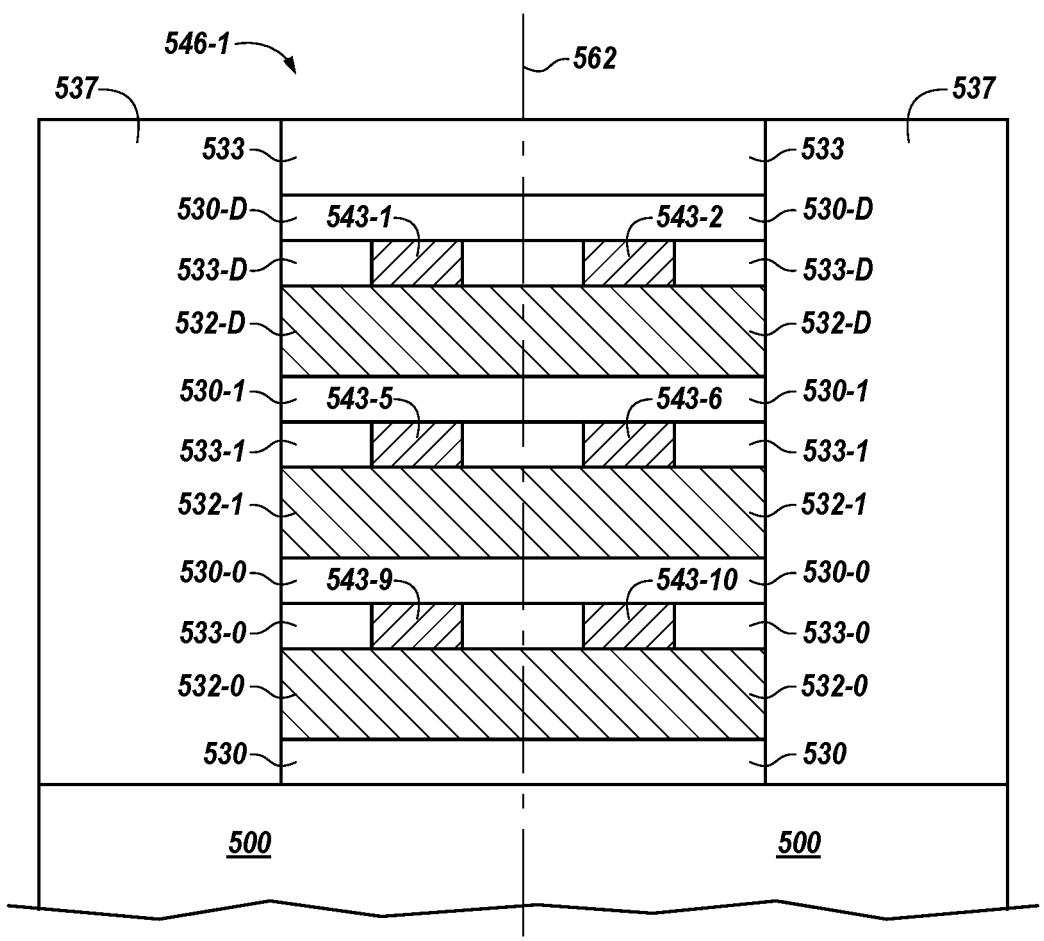

FIG. 5J is a cross-sectional view along line B-B' of FIG. 5I after the process described in connection with FIG. 5I has been performed. As with FIG. 5I. FIG. 5J shows a fourth dielectric material 537 may be deposited into regions on the sides of the stack.

Figure 5K:
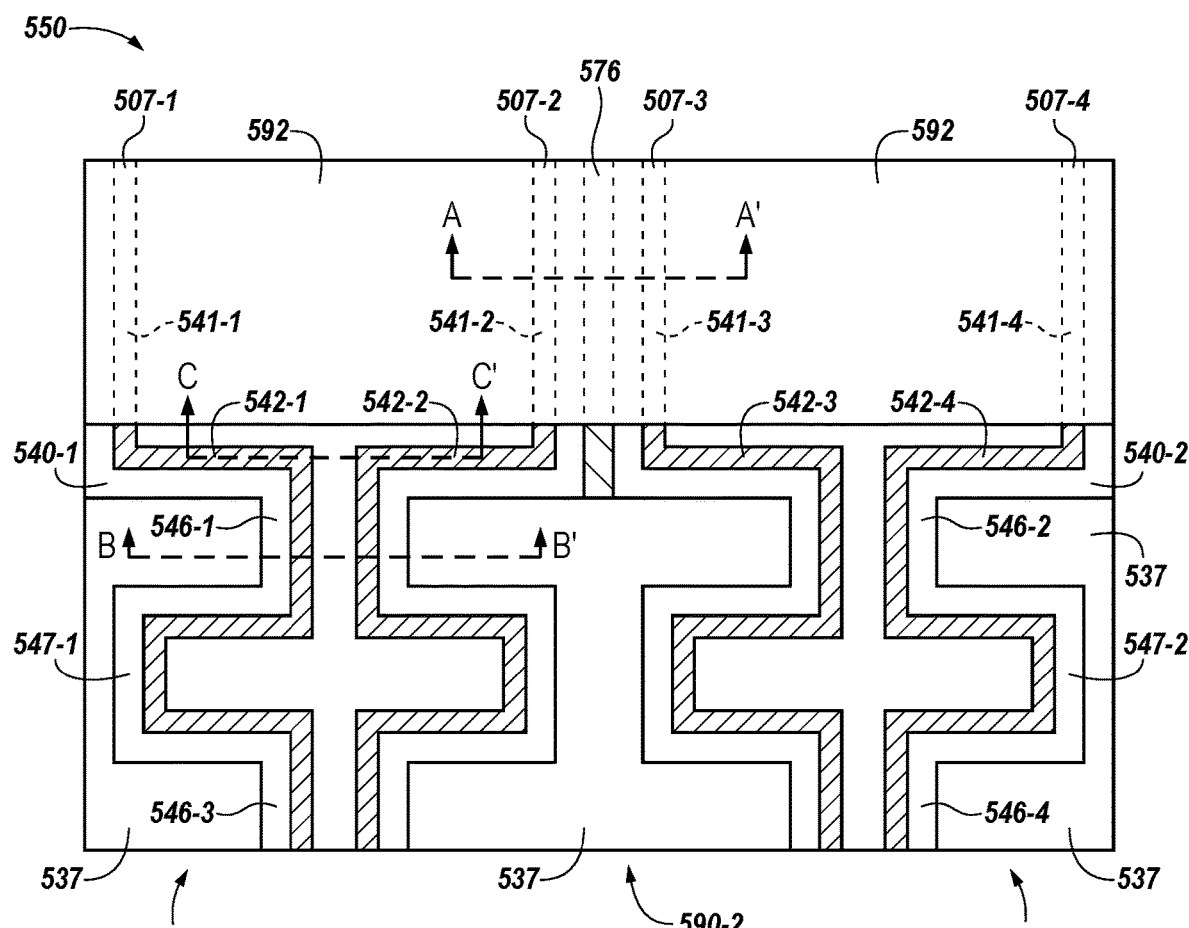

FIG. 5K is an overhead view of another stage of a method for forming conductive line contact regions having multiple multi-direction conductive lines and the staircase conductive line contact structures for semiconductor devices, in accordance with one or more embodiments of the present disclosure. In some embodiments, a hard mask material (e.g., a photoresist layer) may be deposited over a portion 592 of the array regions 540-1, 540-2. In other embodiments, a hard mask material may be deposited over a part of each memory array region. The hard mask material may serve to protect the memory cell array regions and body contacts throughout the remainder of the processes described herein.

In some embodiments, a photoresist layer may be deposited over region 592. The photoresist layer may serve as a protective layer to keep the portions of the memory cell array that are not being removed intact during the staircase formation process.

Further, as shown in FIG. 5K, a portion of the array regions (e.g., 540-1 and 540-2) having the portions (e.g., 542-1 and 542-2) of the digit lines therein can be exposed for further processing as described in more detail below. In this manner, part of the staircase structure can be formed.

Figure 5L:
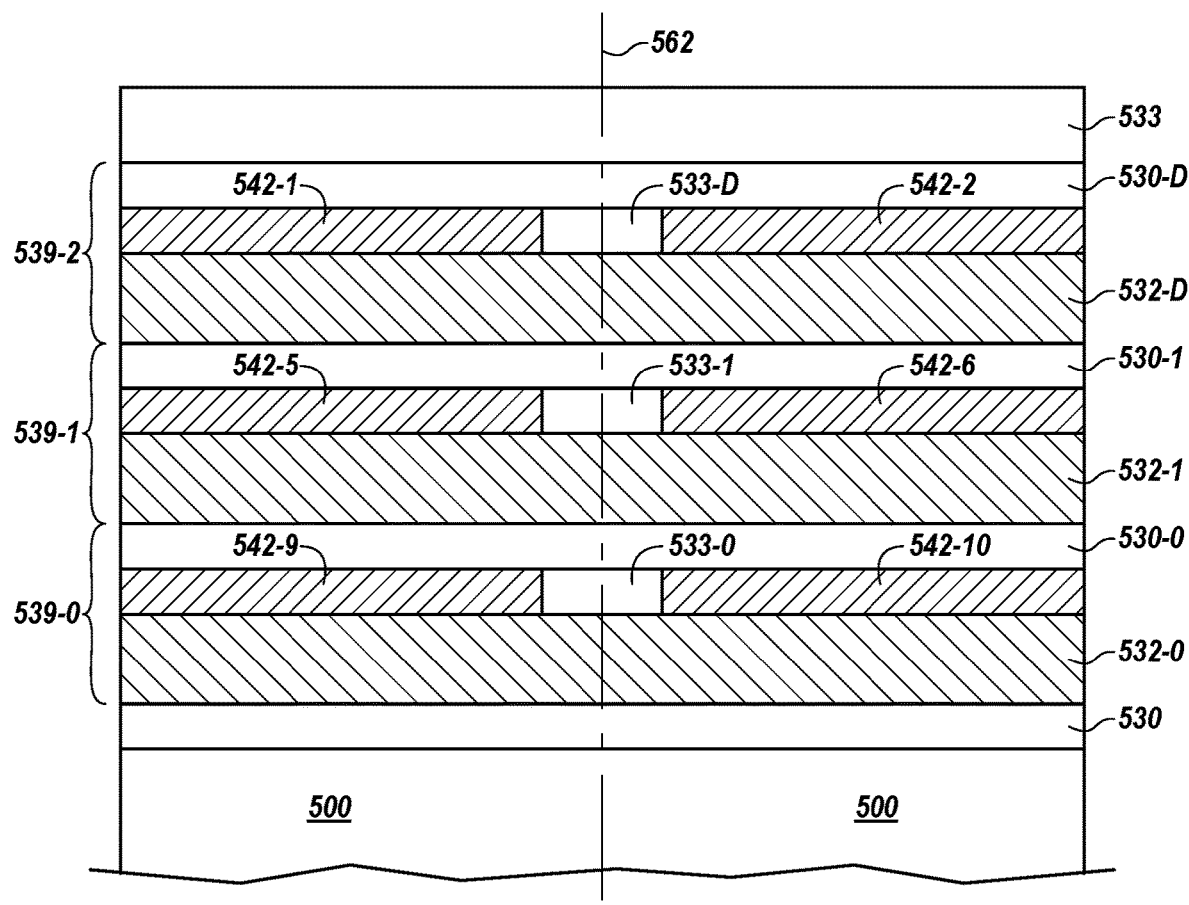

FIG. 5L illustrates a cross-sectional view along line C-C' of FIG. 5K. In other words, FIG. 5L illustrates a cross-sectional view along the second portions 542-1 and 542-2 of conductive lines shown in FIG. 5K. As illustrated in FIG. 5L, each memory cell region includes a vertical stack of horizontally oriented conductive lines, each conductive line comprising a portion 542, extending in a horizontal direction.

Each memory cell region may include a number of groups of layers (e.g., 539-1, 539-2, 539-3), wherein each group of layers includes a first dielectric material layer 530-0, . . . , 530-D, a semiconductor material layer 532-0, . . . , 532-D, and a second dielectric material layer 533-0, . . . , 533-D. The second dielectric material having one or more conductive lines formed therein.

For example, the second dielectric material layer 533-0, . . . , 533-D of each group of layers 539-0, . . . , 539-2 may include second portions 542 of one or more conductive lines. Each memory cell 540-1, . . . , 540-W may include a layer 533 of a second dielectric material above the top group of layers 539-2.

Figure 5M:
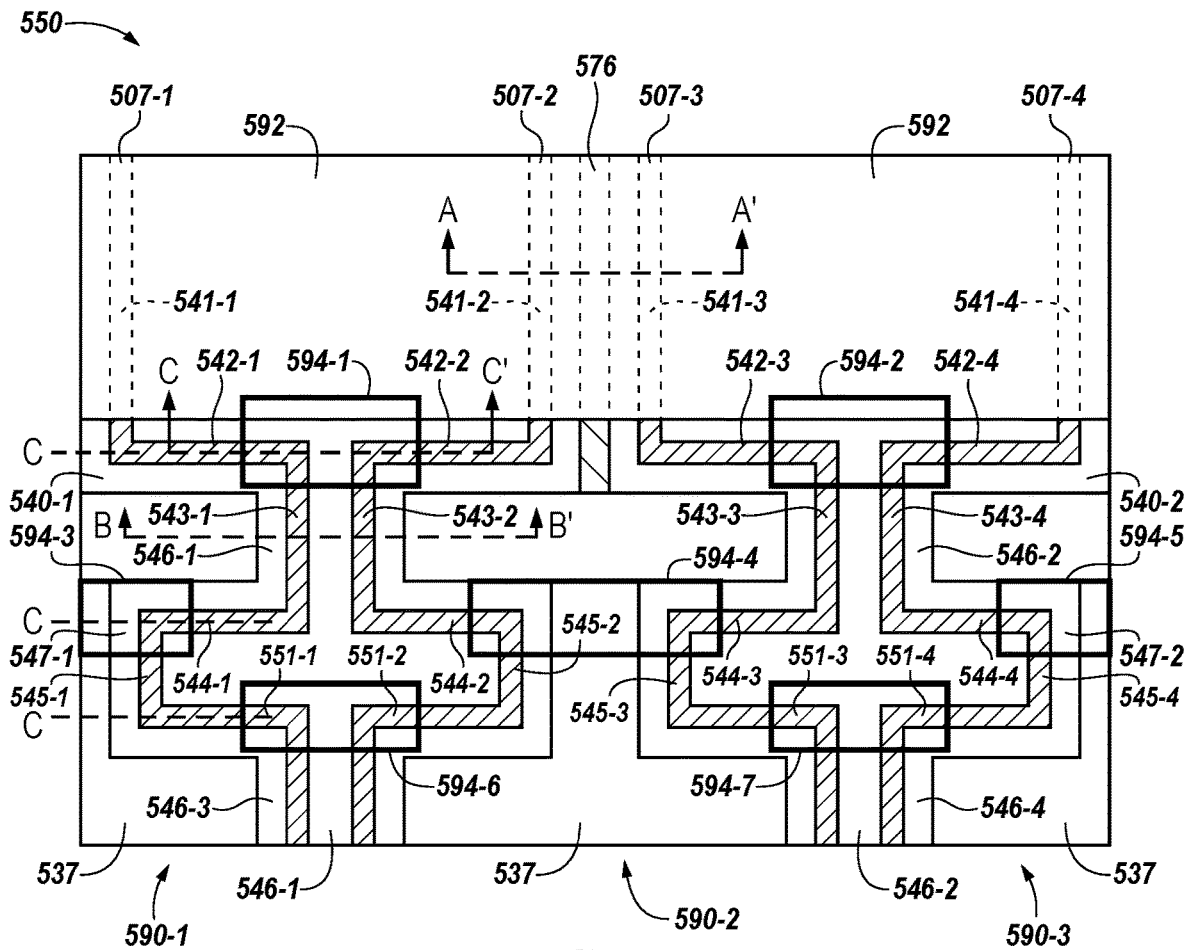

FIG. 5M is an overhead view of a stage of a method embodiment for forming conductive line contact regions having multiple multi-direction conductive lines and the staircase conductive line contact structures in an odd-even arrangement for semiconductor devices, in accordance with one or more embodiments of the present disclosure. As shown in FIG. 5M, in some embodiments, each conductive line may include a third portion (e.g., 543-1, . . . , 543-4) extending in a third horizontal direction at an angle to the second horizontal direction. In some embodiments, as shown in FIG. 5M, the third portion 543-1, . . . , 543-4 may extend at an angle perpendicular to the second portion 542-1, . . . , 542-4 and parallel to the first portion 541-1, . . . , 541-4.

In some embodiments, a masking, patterning, and etching process can be used with selectively open regions, such as 594 (e.g. regions 594-1, . . . , 594-2) identified by the rectangles shown in FIG. 5M to form a staircase structure as described below. The regions may each be a region that spans across multiple areas of the array structure. For example, the regions can include parts of the array regions 540, bridges 546, and conductive line contact regions 547.

Regions 594 may include vertically stacked groups of layers as described in connection with FIG. 5L and material may be removed in various regions to form structures such as those shown in FIG. 5S. For example, regions 594-1, . . . , 594-2 may include vertically stacked groups of layers, where each group of layers includes a first dielectric material layer, a semiconductor layer, and a second dielectric material layer with conductive lines formed therein. For example, regions 594-1, . . . , 594-2 may include groups of layers 539-0, . . . , 539-2 as shown in FIG. 5L.

Figure 5N:
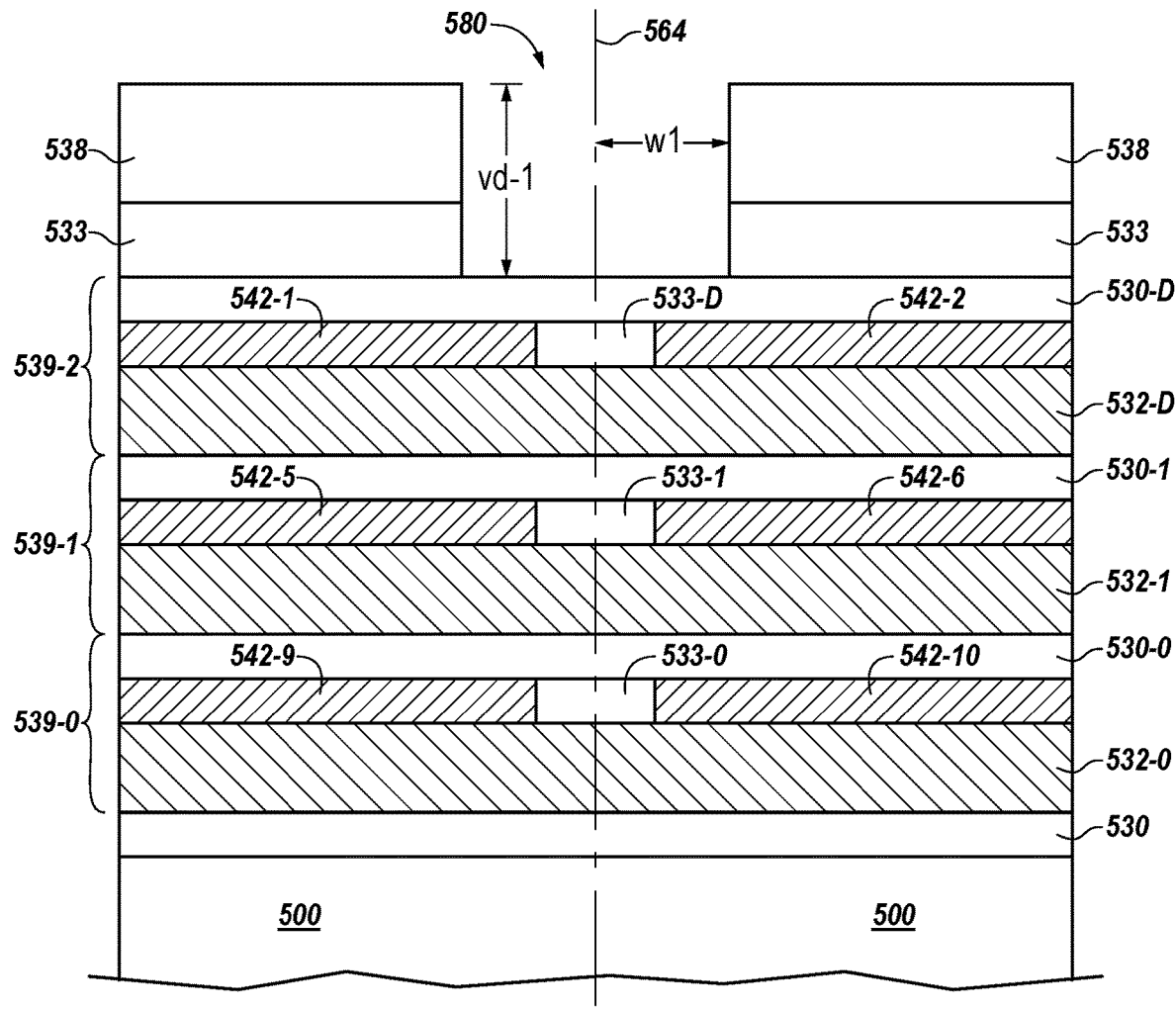
Figure 5O:
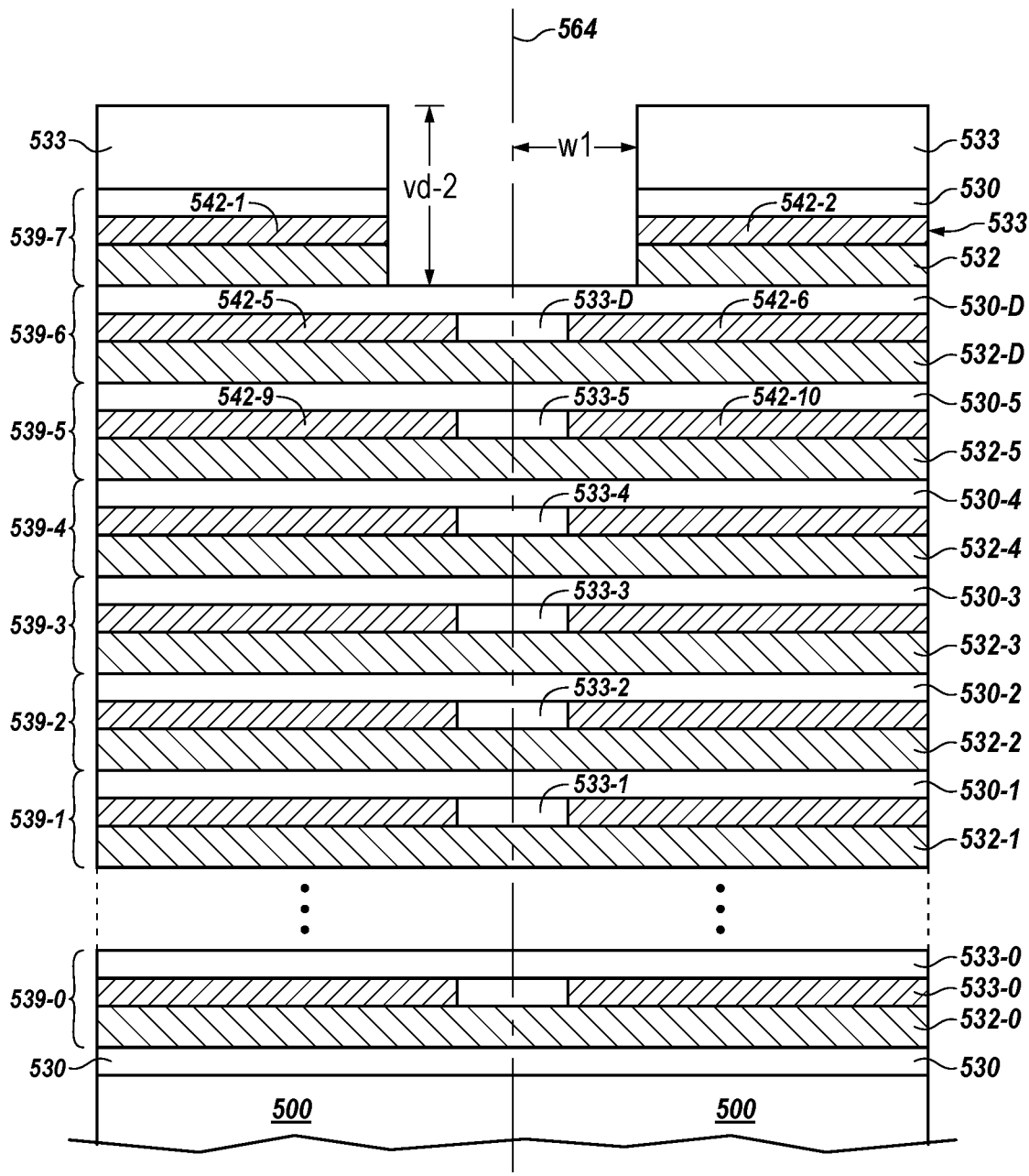
Figure 5P:
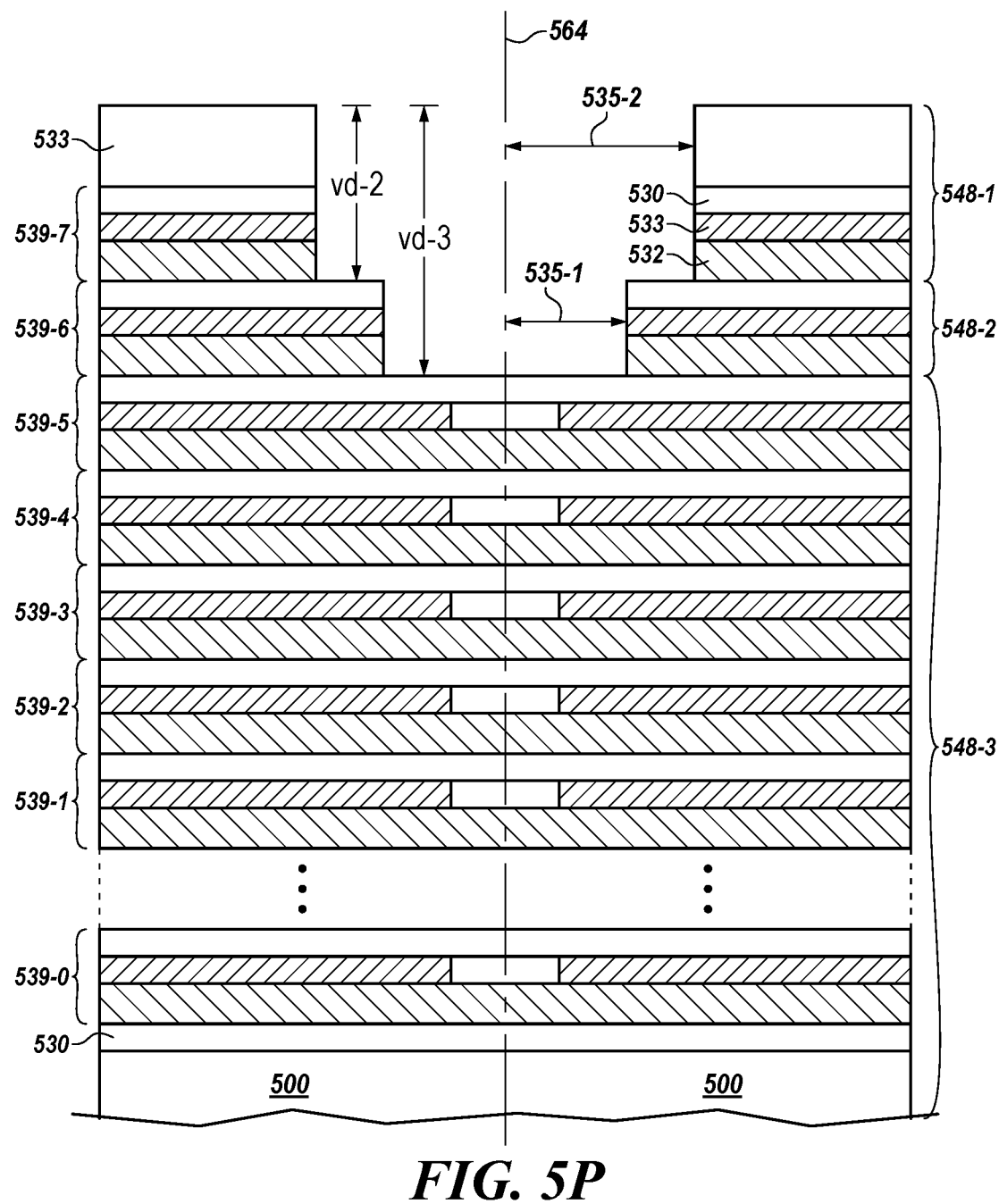
Figure 5Q:
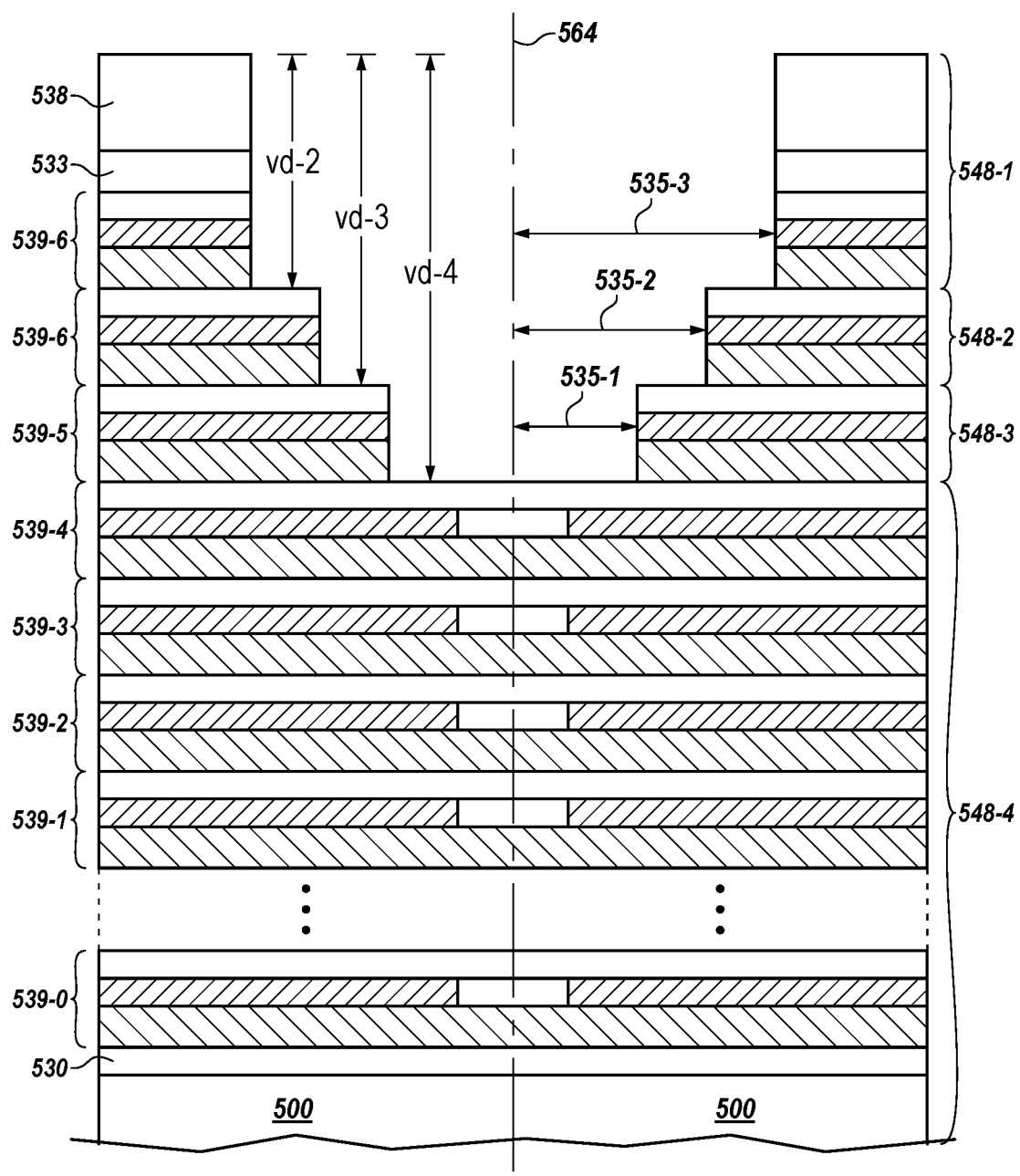
Figure 5R:
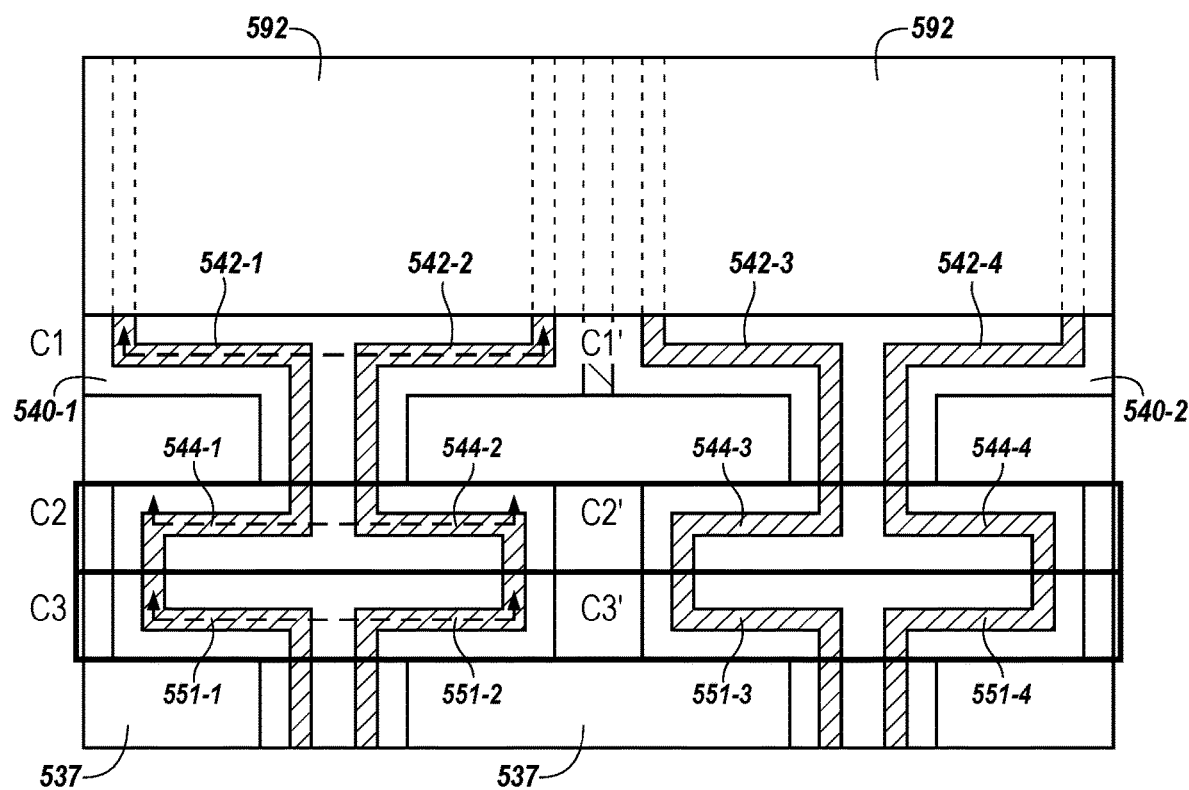
Figure 5S:
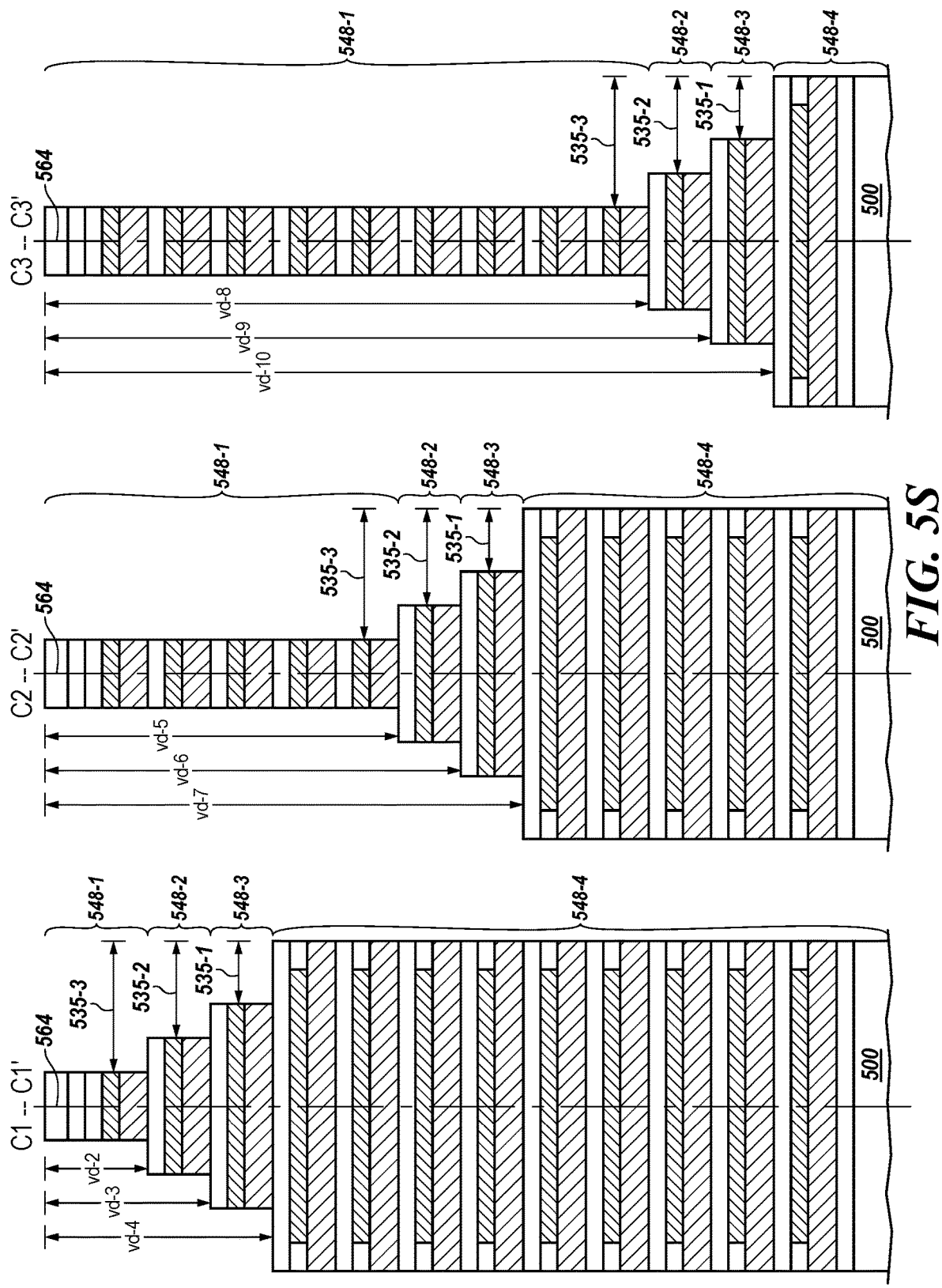

The regions 594-1 through 594-7 in FIG. 5M are regions that have been opened to create the lowest levels of the staircases, such as levels 535-1 in the illustrations of FIG. 5S. As will be understood by the reader, the illustration in 5M represents the opening regions used to form the lowest levels of the staircase and are located directly above those parts of the staircase. Consequently, when forming other layers of the staircase, such as 535-2 and 535-3 shown in FIG. 5S, different areas will be opened to form those structures.

One methodology that can be used to form these staircases involves two processes. First, an etch-trim sequence can be used to form the stairs themselves and then cut or chop masks can be used to get the stair structure down to the desired level of the tiered stack of layers. Typically, a series of stairs, such as the three stairs shown in C1-C1' of FIG. 5S (e.g., 535-1, 535-2, and 535-3 shown in FIG. 5S) are formed and then that whole series of stairs is brought to their desired levels (e.g., vd-2, vd-3, vd-4 shown in FIG. 5S) through the cut or chop mask process. For deeper tiers, more than one cut or chop mask may be used.

Additionally, if multiple staircases (e.g., three levels of stairs) are being formed at different locations (e.g., C1-C1', C2-C2', C3-C3' in FIG. 5R) then, in some embodiments, all of the staircases can be formed at the same levels (e.g., all sets of stairs are formed with vertical depths of vd-1, vd-2, vd-3) and then different cut or chop mask processes can be used to drop these sets of stairs to different levels. For example, both of the staircases shown at C1-C1' and C3-C3' of FIG. 5S can initially have vertical depths of vd-1, vd-2, and vd-3, but further cut or chop mask processing can be done at C3-C3' to drop that set of stairs to vd-8, vd-9, and vd-10.

Imaginary reference lines may, for example, run through the centers of each memory cell array to provide the reader with a reference as the formation process is discussed herein. A vertical opening may be formed, as illustrated in FIG. 5N. In some embodiments, the reference line may be central to the vertical opening. In some embodiments, the vertical opening may be centered around the intersection of the reference line and line C-C'.

FIG. 5N is a cross-sectional view along line C-C' of FIG. 5M. As shown in FIG. 5N, a vertical opening 580 may be formed through the layers within the vertically stacked memory cells to expose vertical sidewalls in the vertical stack. Imaginary reference lines 564 may run through the centers of each memory cell array region. A vertical opening 580 may be formed. In some embodiments, the reference line 564 may be central to the vertical opening 580. In some embodiments, the vertical opening 580 may be centered around the intersection of the reference line 564 and line C-C'.

The vertical opening 580 may be of a first horizontal width ("w1" in FIG. 5N) and a first vertical depth ("vd-1" shown in FIG. 5N). The vertical opening 580 may be formed by selectively removing the top layers 538, 533 and then one or more groups of layers of the groups of layers 539-0, . . . , 539-2 of the vertical stack. The one or more layers of the vertical stack be selectively removed a first distance on each side of the reference line 564 (i.e., to the left of the reference line 564 and the first distance to the right of the reference line 564).

In some embodiments, the vertical opening 580 may be formed through a mask 538 and the second dielectric material 533. Forming the vertical opening 580 may include removing a first portion of a mask 538 and a first portion of a second dielectric layer 533. The first portions of the mask 538 and second dielectric material later 533 may be equivalent in horizontal length. Although not shown in FIG. 5N, in some embodiments where a mask 538 has not been deposited over the vertical stack 501, the vertical opening 580 may be formed through a top layer of the first dielectric material 530-D and/or a top layer of the second dielectric material 533.

As shown in FIG. 5N, the vertical stack may include layers of the second dielectric material 533 with portions 542 of digit lines formed therein. In some embodiments, the vertical opening 580 may be formed by removing each layer of material between the top of the vertical stack and the first layer of the first dielectric material 530-D.

As shown in FIG. 5N, the vertical stack may include multiple levels (also referred to as tiers) 539-0, . . . , 539-2 (e.g., three tiers shown in FIG. 5N), with each level 539-0, . . . , 539-2 including a layer of the semiconductor material 532, a layer of the first dielectric material 530, and a layer of the second dielectric material 533 with one or more conductive lines formed therein. The vertical stack may include any number of such levels 539-0, . . . , 539-2. As discussed herein, the vertical stack may be formed on a substrate 500.

As shown in more detail in FIGS. 5O-5S, FIG. 5T, FIGS. 6A-6C, a method of forming various levels of an array region may be repeated in any number of iterations to form multi-level conductive line contacts at more than two levels. For example, a method may be repeated in a number of iterations such as to form eight-levels of conductive line contacts, as illustrated in FIGS. 5O-5S, FIG. 5T, FIGS. 6A-6C.

FIG. 5O is a cross-sectional view of an embodiment similar to FIG. 5M taken along line C-C' of FIG. 5M illustrating another stage of a method for forming conductive line contact regions having multiple multi-direction conductive lines and the staircase conductive line contact structures for semiconductor devices, in accordance with one or more embodiments of the present disclosure. In this embodiment, the stack has many more layers 530, 532, 533 and accordingly groups of layers 539.

The vertical depth of the vertical opening may be increased to a second vertical depth "vd-2". This may be done by removing a part of the layer of the second dielectric material 533, where the layer also contains first portions 542-1 and 542-2 of conductive lines formed therein. A part of the semiconductor material layer 532 may also be removed. At this stage, the opening into layers 533 (top layer), 530, 533, and 532 all have the same as width w1, as shown in FIG. 5O.

FIG. 5P is a cross-sectional view of an embodiment similar to FIG. 5M taken along line C-C' of FIG. 5M illustrating another stage of a method for forming conductive line contact regions having multiple multi-direction conductive lines and the staircase conductive line contact structures for semiconductor devices, in accordance with one or more embodiments of the present disclosure. The method includes creating a first level 548-1 and a second level 548-2 that are different from the remainder of the layers in level 548-3 of a vertical stack.

This may be done by removing a first portion of each layer of a first group of layers a second distance 535-2 back from the reference line 564 on either side, where the second distance 535-2 is greater than the first distance 535-1. And, by removing a first portion of each layer of a second group of layers a first distance 535-1 back from the reference line 564 on either side, where the second distance 535-2 is greater than the first distance 535-1. This will also create two different depths vd-2 (for the top/first level 548-1) and vd-3 (for the second level 548-2).

In some embodiments, the top level 548-1 may include a mask (e.g., a photoresist layer) not shown in FIG. 5P, a top second dielectric material layer 533, a first dielectric material layer 530, a second dielectric material layer 533 with portions of the digit lines formed therein, and a semiconductor material layer 532, as discussed in previous figures. However, embodiments of the present disclosure are not so limited.

FIG. 5Q illustrates the formation of a third level 548-3 comprising a layer of a semiconductor material, conductive lines, and a layer of a first dielectric material. The method includes creating a first level 548-1, a second level 548-2, and a third level 548-3 that are different from the remainder of the layers in level 548-4 of a vertical stack. This may be done by removing a portion of each layer of a first group of layers 548-1 a third distance 535-3 back from the reference line 564 on either side, where the third distance 535-3 is greater than the first and second distances 535-1 and 535-2. And, by removing a portion of each layer of a second group of layers 548-2 a second distance 535-2 back from the reference line 564 on either side, where the second distance 535-2 is greater than the first distance 535-1. And, further, by removing a portion of each layer of a third group of layers 548-3 a first distance 535-1 back from the reference line 564 on either side, where the second distance 535-2 is greater than the first distance 535-1. This will also create three different depths vd-2 (for the first level 548-1), vd-3 (for the second level 548-2), and vd-4 (for the third level 548-3).

FIG. 5R illustrates an overhead view of another stage of a method of forming conductive line contact regions having multiple multi-direction conductive lines and the staircase conductive line contact structures for semiconductor devices, in accordance with one or more embodiments of the present disclosure. Line C1-C1' runs along the second portions 542-1 and 542-2, line C2-C2' runs along the fourth portions 544-1 and 544-2, and line C3-C3' runs along the second portion 551-1 and 551-2. As discussed below, each of these areas is formed differently to allow for connections to be formed to different levels of the stack.

FIG. 5S illustrates cross-sections along lines C1-C1', C2-C2', and C3-C3' of FIG. 5R, illustrating different structures that can be used to access different levels of the stack. Each cross-section includes the same vertical stack of horizontally oriented digit lines and layers of the first dielectric material 530, the semiconductor material 532, and the second dielectric material 533, but at different viewing lines to see the different staircase patterns that are formed in different locations within the stack. As illustrated in FIG. 5S, a group of layers 548-4 at the bottom of the vertical stacks may remain unaltered (no material removed). As can be understood from FIG. 5S, the number of layers in the group of layers 548-4 can change based on the layers to be accessed for contact with sense amplifiers or other circuitry.

In the representation on the left of FIG. 5S, multiple levels 548-1, 548-2, and 548-3 can be accessed at depths in the stack of vd-2, vd-3, and vd-4. Further, in the representation in the middle of FIG. 5S, multiple levels 548-1, 548-2, and 548-3 can be accessed at depths in the stack of vd-5, vd-6, and vd-7, and in the representation on the left of FIG. 5S, multiple levels 548-1, 548-2, and 548-3 can be accessed at depths in the stack of vd-8, vd-9, and vd-10. This is achieved by have a vertical opening having different widths 535-1, 535-2, and 535-3 from a reference line 564. Although three widths are illustrated any suitable number of widths can be created.

Figure 6A:
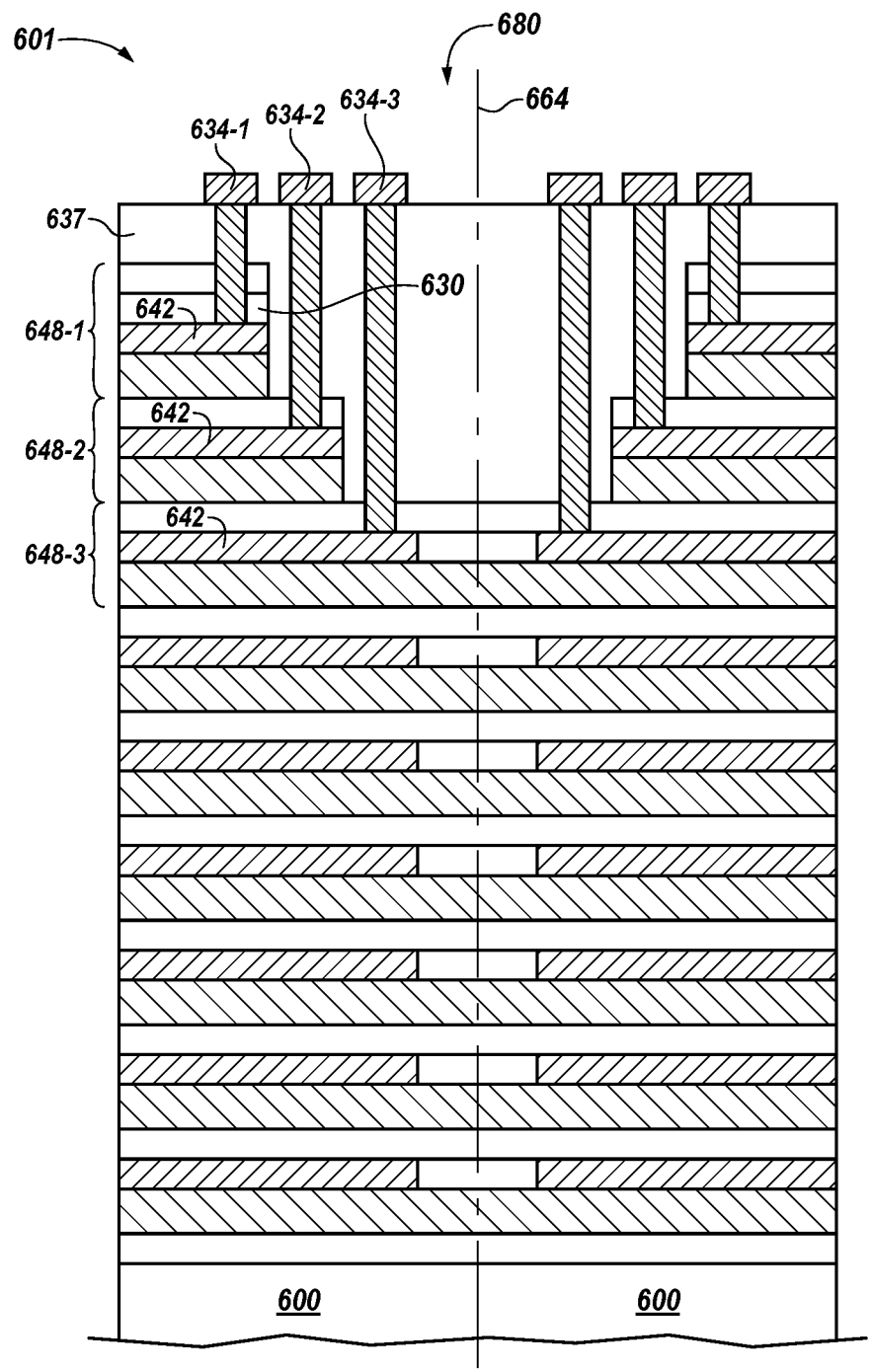
FIG. 6A-6C are cross-sectional views illustrating a conductive line and staircase contact structures for different tiers for a vertical memory array in accordance with one or more embodiments of the present disclosure.
Figure 6B:
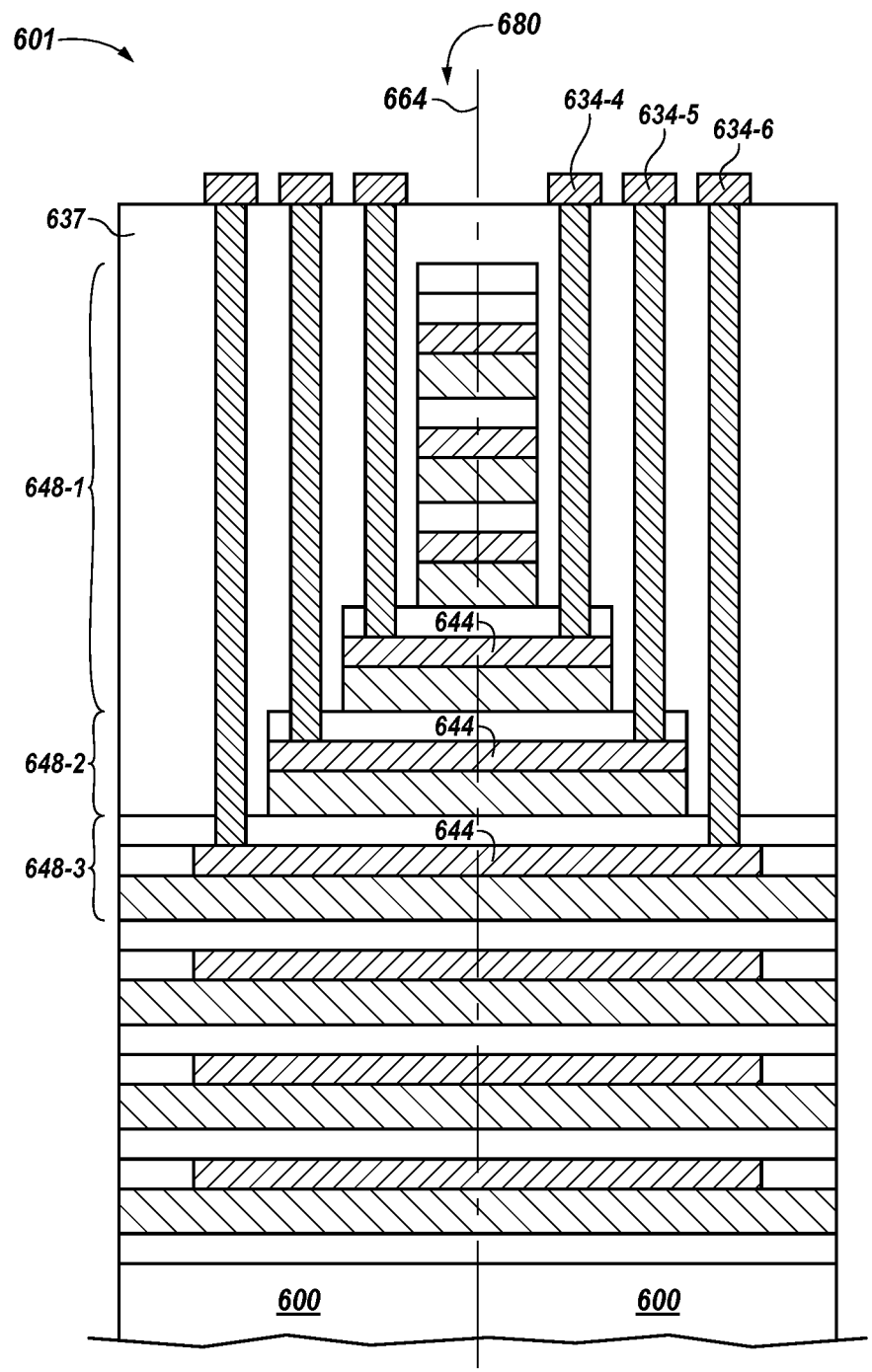
Figure 6C:
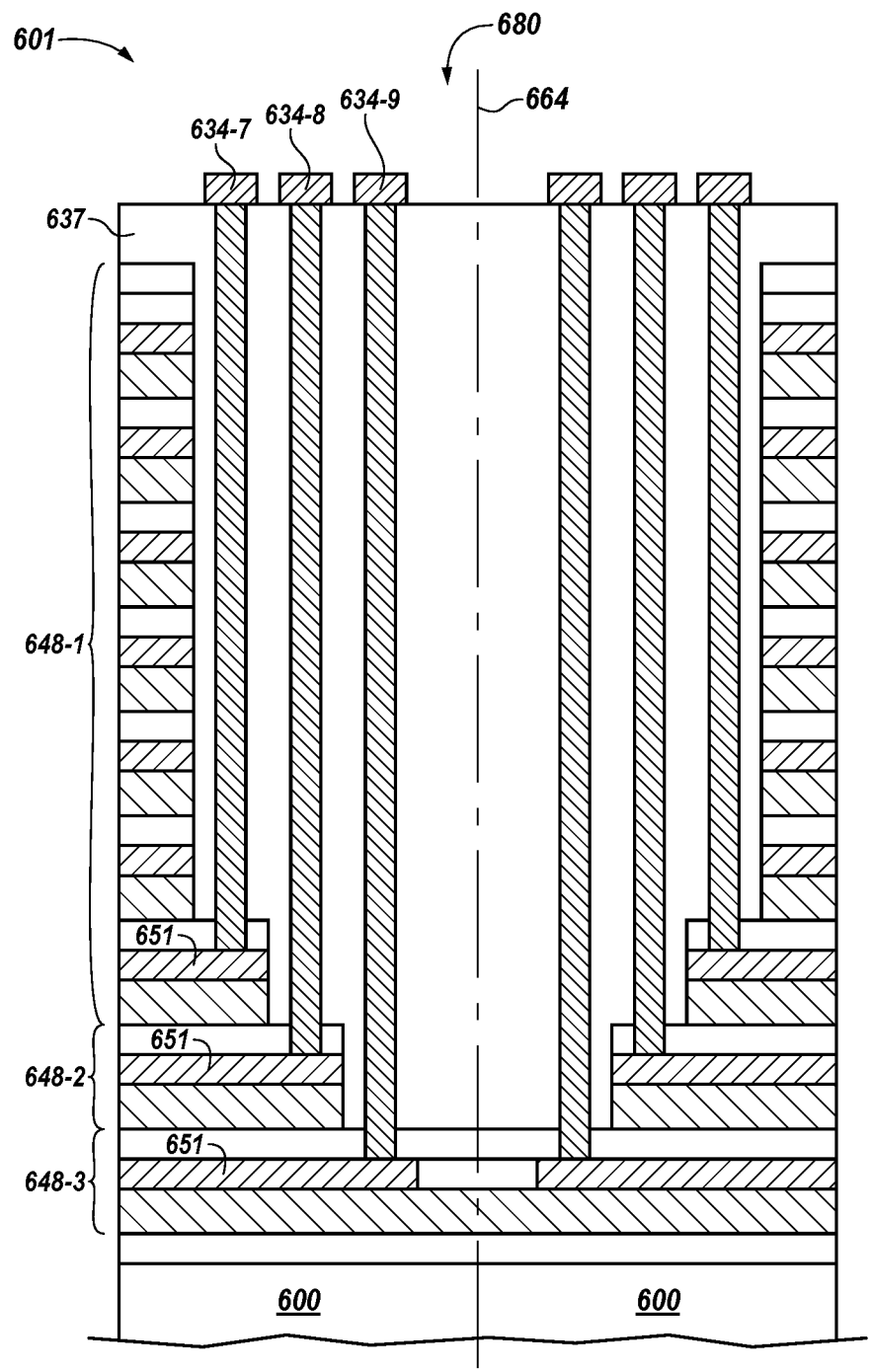

Using this staircase structure allows for direct vertical contacts to be made with the sense amplifiers or other circuitry, as are illustrated in FIGS. 6A-6C. In the embodiment illustrated in FIG. 5S, this allows for conductive line contacts to nine sense amplifiers or other circuits, thereby providing added density to the conductive line contact region that could not be provided previously. It should be understood by the reader that this staircase concept could be utilized to connect conductive lines to many (e.g., hundreds) of sense amplifiers or other circuits.

Figure 5T:
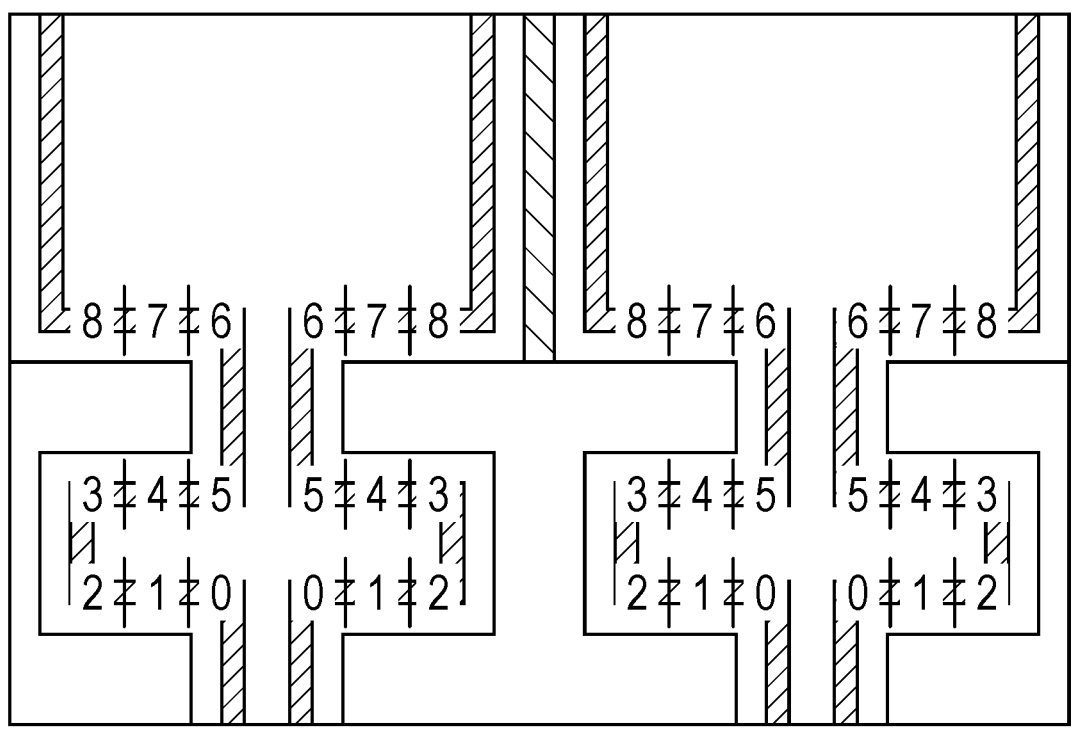

FIG. 5T illustrates an overhead view illustrating an example of the number of connections and an example arrangement thereof on the conductive line contact regions having multiple multi-direction conductive lines, in accordance with one or more embodiments of the present disclosure. This figure illustrates vertical connection areas where contacts between digit lines and sense amplifiers can be made. Although as illustrated, each horizontal digit line area has three vertical connection areas where contacts can be positioned, more or less could be provided based on the space available for the connections. In the illustration shown, the left side of the left array has three connection areas along each horizontal conductive line portion. For example, positions labeled 0, 1, and 2 will each connect with a second portion 542/642 of a different vertical tier of the vertical stack as shown in FIG. 6A. Each array shown in FIG. 5T has 9 interconnection locations available (labeled 0, 1, 2, 3, 4, 5, 6, 7, 8), although the embodiments of the present disclosure could have more or less interconnection locations. As may be understood based on the numbering of the interconnection locations, the area with interconnections 876-678 and the area with interconnection locations 210-012 are configured as valleys as shown in FIG. 5S at C1-C1' and C3-C3', while the area where the interconnection locations 345-543 are configured as a peak as shown in FIG. 5S at C2-C2'. If more horizontal portions (and corresponding vertical levels) are provided, more connection areas could be created.

FIG. 6A is a cross-sectional view along line C1-C1' of FIG. 5R. FIG. 6A is a cross-sectional view along line C2-C2' of FIG. 5R. FIG. 6C is a cross-sectional view along line C3-C3' of FIG. 5R. These figures illustrate other example stages of a method of forming conductive line contact regions having multiple multi-direction conductive lines and the staircase conductive line contact structures for semiconductor devices, in accordance with one or more embodiments of the present disclosure.

In some embodiments and as shown in FIGS. 6A-6C, a fourth dielectric material 637 may be deposited into the vertical opening 680. The fourth dielectric material 637 may be similar in composition to the first dielectric material 630. For example, in some embodiments, the first dielectric material 630 and the fourth dielectric material 680 may each include an oxide material.

The portions of the different levels of digit lines 642, 644, and 651 illustrated in FIG. 6A-6C may correspond to the portions of the different levels of digit lines 542, 544, and 551, illustrated in FIG. 5R. As shown in FIG. 4C and in FIGS. 6A-6C, a number of sense amplifiers or other circuitry may each be coupled to a digit line via interconnections 634. Each level of the vertical stack may include digit lines 642, 644, or 651 coupled to a sense amplifier or other circuitry via interconnections 634 on either side of the reference line 664. In some embodiments, each digit line portion 642, 644, and 651 in the vertical stack 601 may be of a length greater than that of the respective digit line 642, 644, or 651 above it in the vertical stack 601.

As illustrated in FIGS. 6A-6C, each interconnection 634 may be coupled to a conductive line portion 642, 644, or 651 at or near an end of that conductive line portion 642, 644, or 651 (i.e., near the end of a given level 648). In some embodiments, the number of interconnections 634 may be equal to twice the number of levels 648 due to there being two conductive lines in each array region (e.g., array region 504-1 of FIG. 5C). For example, a three-level staircase structure as illustrated in FIG. 6A may have six interconnections (e.g., in a folded digit line architecture) as shown.

Figure 7:
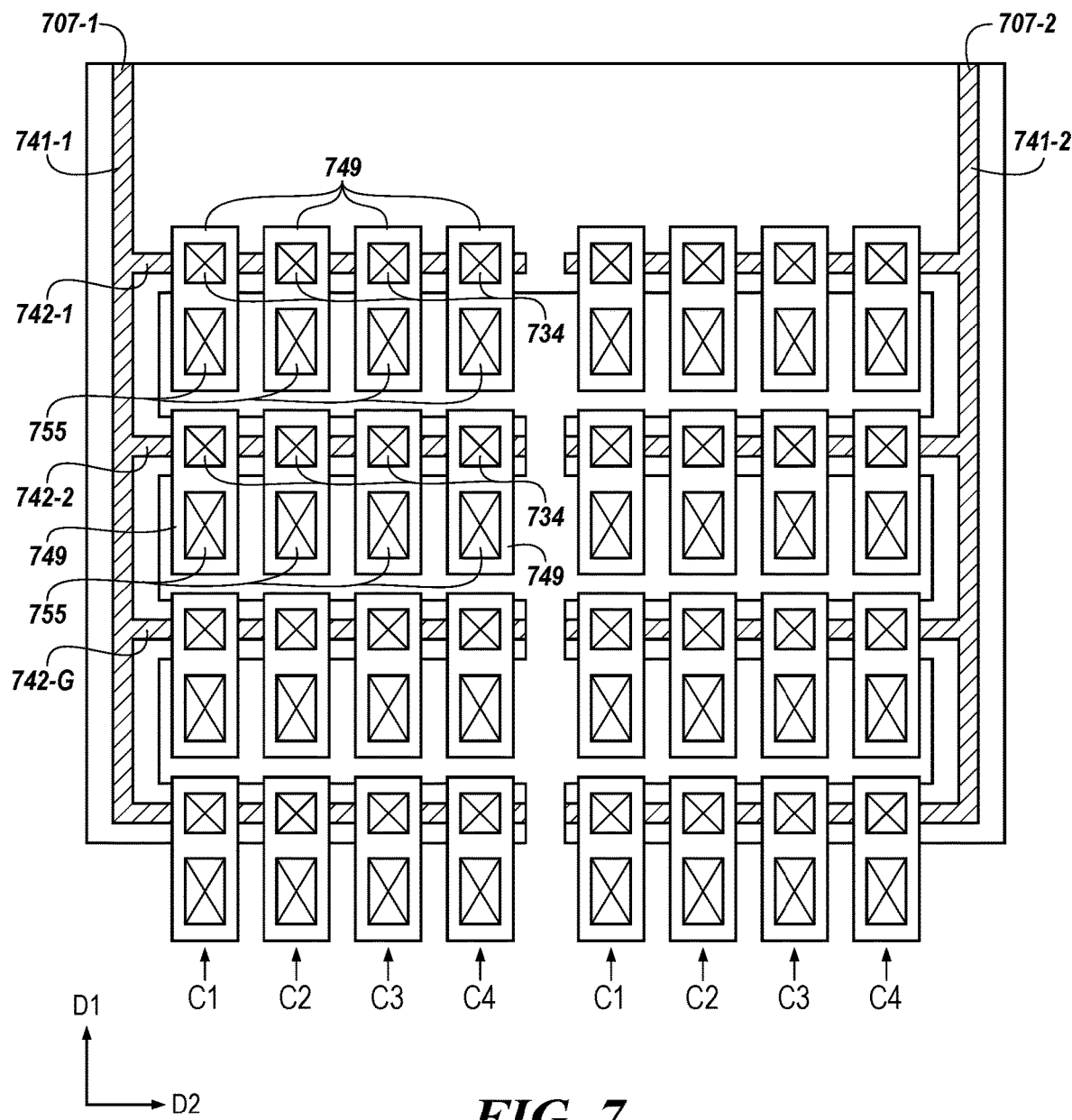
FIG. 7 is an overhead view of a three-dimensional (3D) memory array in accordance with one or more embodiments of the present disclosure.

FIG. 7 is an overhead view of a 3D memory array illustrating another embodiment of the present disclosure. In this embodiment, as illustrated in FIG. 7, conductive lines (707-1, 707-2) may be formed having a multi-tined fork arrangement (when viewed from above the vertical stack as illustrated in FIG. 7) such that a first portion 741 (e.g., 741-1, 741-2) of a conductive line is aligned in a first direction D1 (e.g., aligned with one side of the memory array) and the second portions 742 (i.e., each located on different tiers of layers of the vertical stack) are at an angle to the first portion (e.g., in direction D2). The second portions 742 are also spaced laterally (e.g., arranged parallel to each other) to allow vertical interconnections to be formed for each segment 742.

In some embodiments, each secondary portion 742-1, . . . , 742-G may extend at an angle perpendicular to the first portion 741. In other words, the first portion 741 may extend in the D1 direction, and the secondary portions 742-1, . . . , 742-G may each extend in the D2 direction. For example, FIG. 7 illustrates four secondary portions 742-1, . . . , 742-G of conductive lines 707-1 and 707-2 extending in a second direction D2 perpendicular to a first direction D1 of a first portion 741-1 and 741-2 of the conductive lines 707-1 and 707-2, respectively.

Each secondary portion 742-1, . . . , 742-G may be interconnected to a sense amplifier or other circuitry contact 755 via contact jumpers 749, for example. In some embodiments, the number of contact jumpers 749 to sense amplifiers or other circuitry coupled to each secondary portion 742-1, . . . , 742-G may be equal to the number of secondary portions 742-1, . . . , 742-G of each conductive line. Although FIG. 7 illustrates four secondary portions 742-1, . . . , 742-G, embodiments of the present disclosure may have other suitable amounts of secondary portions.

Each contact jumper 749 may be coupled to a conductive line 707 through a interconnection 734. The interconnections 734 may include interconnections to source/drain regions. In some embodiments, the source/drain region may be formed within a semiconductor material. In some embodiments, the secondary portions 742-1, . . . , 742-G may be spaced approximately equidistant from one another. Contact jumpers 749 coupled to the top tine of secondary portions 742-1, . . . , 742-G may be aligned in columns $C_1$, $C_2$, $C_3$, and $C_4$. Another suitable arrangement is shown below in FIG. 8.

Figure 8:
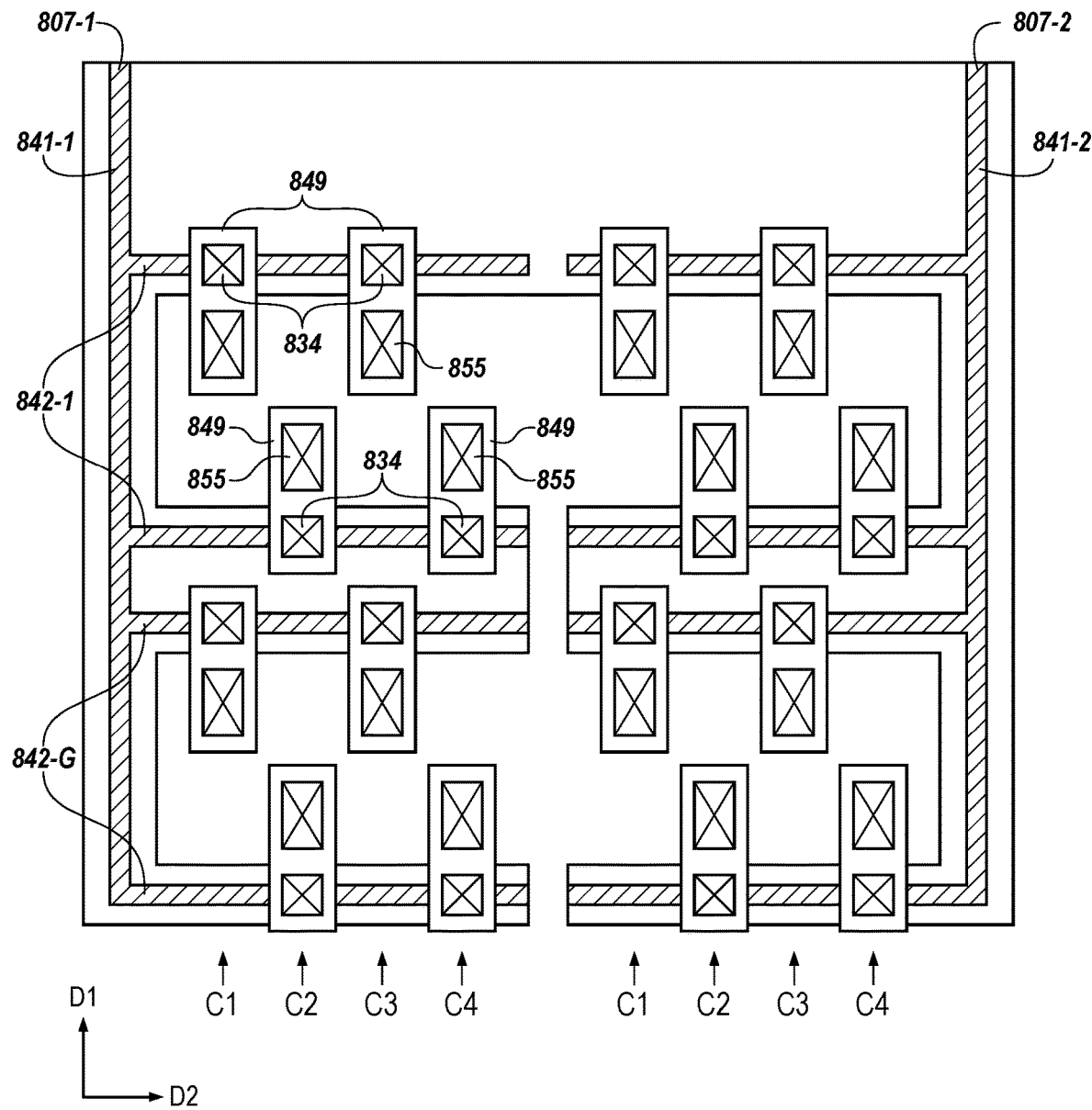
FIG. 8 is an overhead view of a three-dimensional (3D) memory array in accordance with one or more embodiments of the present disclosure.

FIG. 8 is a top-down view illustrating another embodiment of a multiple multi-direction conductive line structure and staircase contact configuration structure for a memory device. As illustrated in FIG. 8, each tine of the forked arrangement of secondary portions 842-1, . . . , 842-G may be coupled to two interconnections 834 connected to a number of contact jumpers 849 that connect to sense amplifiers or other circuitry 855. For example, contact jumpers 849 coupled to the top tine of secondary portions 842-1, . . . , 842-G may be aligned in columns $C_1$ and $C_3$ and contact jumpers 849 coupled to the bottom line of secondary portions 842-1, . . . , 842-G may be aligned in columns $C_2$ and $C_4$. Each secondary portion 842-1, . . . , 842-G may be interconnected to a sense amplifier or other circuitry contact 855 via contact jumpers 849, for example. Each contact jumper 849 may be coupled to a conductive line 807 through an interconnection 834.

Figure 9:
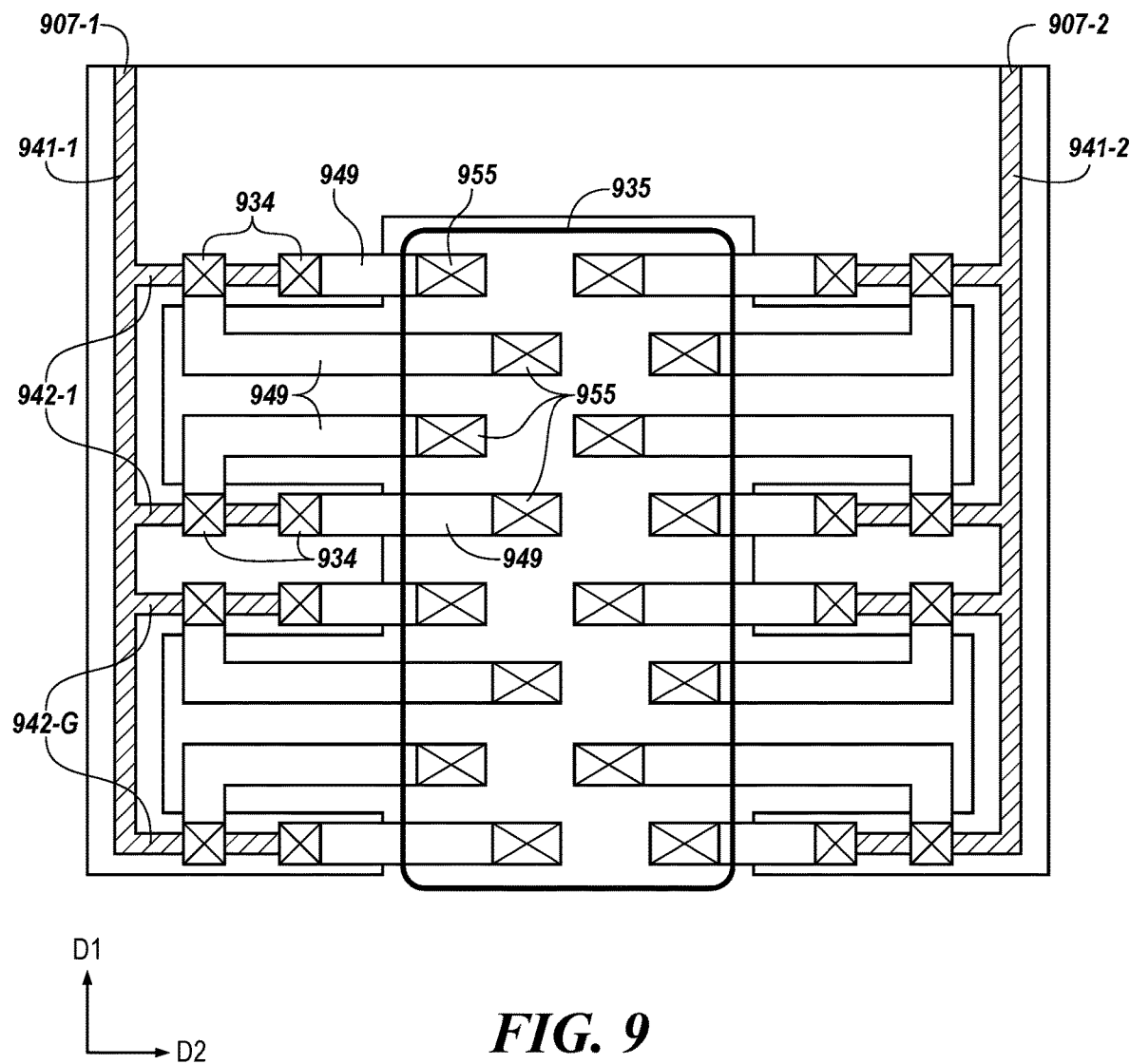
FIG. 9 is an overhead view of a three-dimensional (3D) memory array in accordance with one or more embodiments of the present disclosure.

FIG. 9 is a top-down view illustrating another embodiment of a multi-direction conductive line and staircase contact configuration for a semiconductor device. As illustrated in FIG. 9, each conductive line 907 (e.g., 907-1, 907-2) may include a first portion 941 (e.g., 941-1, 941-2) extending along an edge of a body contact. Each conductive line 907 may further include secondary portions 942-1, . . . , 942-G extending at an angle perpendicular to the first portion 941-1, 941-2. Each secondary portion 942-1, . . . , 942-G may be coupled to one of a number of contact jumpers 949 to sense amplifiers through one of a number of interconnections 934. Each contact jumper 949 may be coupled to a sense amplifier at area 935 through one of a number of sense amplifier contacts 955. One or more of the contact jumpers 949 may include a first portion extending in a first direction D1 and a second portion extending in a second direction D2 and coupled to a secondary portion 942-1, . . . , 942-G of the conductive lines 907 through an interconnection 934. One or more of the contact jumpers 949 may include only a first portion extending in a first direction D1 and coupled to a secondary portion of the conductive line 942-1, . . . , 942-G through an interconnection 934.

Figure 10:
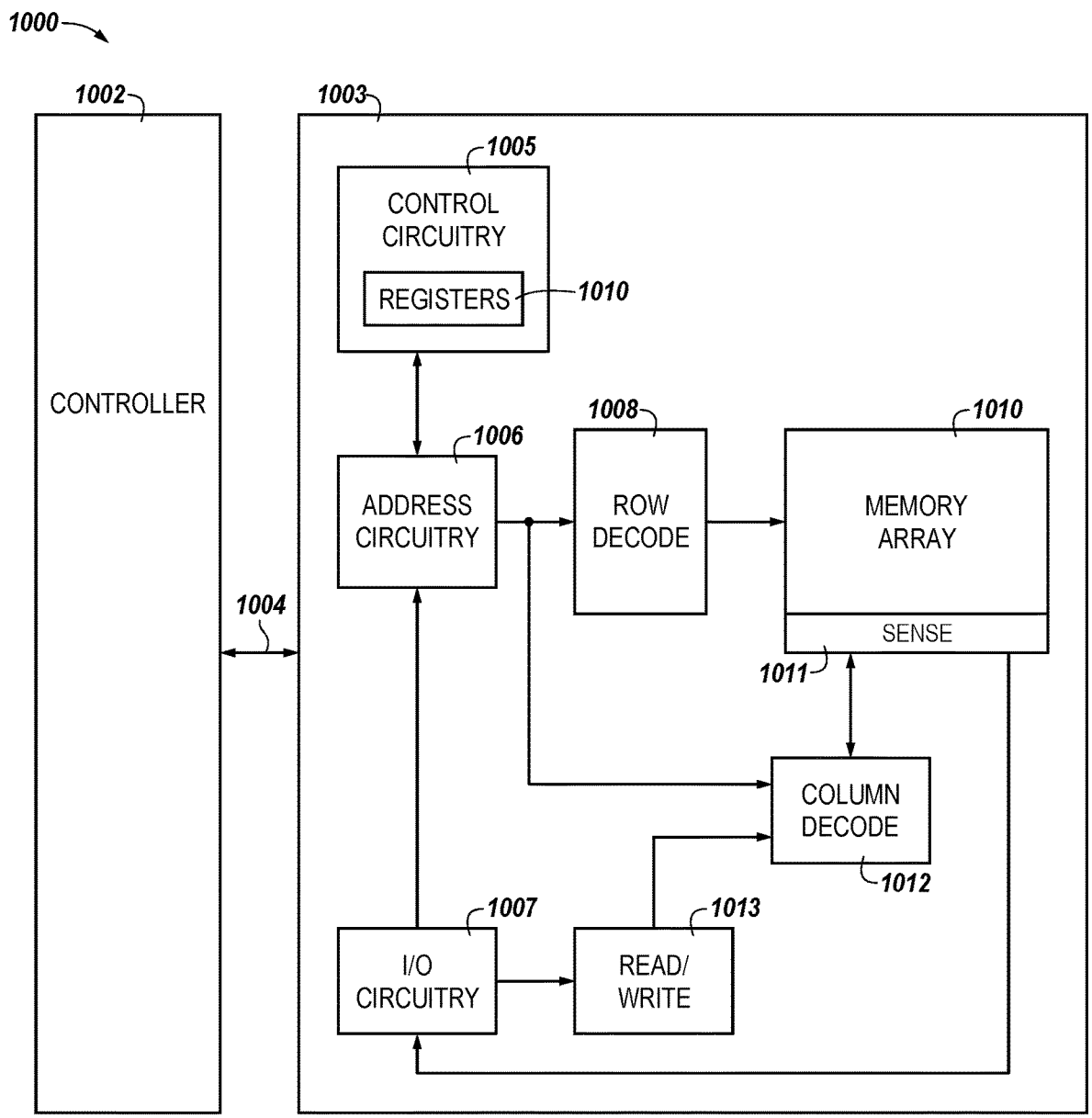
FIG. 10 is a block diagram of an apparatus in the form of a computing system including a memory device in accordance with a number of embodiments of the present disclosure.

FIG. 10 is a block diagram of an apparatus in the form of a computing system 1000 including a memory device 1003 in accordance with a number of embodiments of the present disclosure. As used herein, a memory device 1003, a memory array 1010, and/or a host 1002, for example, might also be separately considered an "apparatus." According to embodiments, the memory device 1002 may include at least one memory array 1010 with a memory cell formed with conductive line contact regions having multiple multi-direction conductive lines and staircase conductive line contact region structures, according to the embodiments described herein.

In this example, system 1000 includes a host 1002 coupled to memory device 1003 via an interface 1004. The computing system 1000 can be a personal laptop computer, a desktop computer, a digital camera, a mobile telephone, a memory card reader, or an Internet-of-Things (IoT) enabled device, among various other types of systems. Host 1002 can include a number of processing resources (e.g., one or more processors, microprocessors, or some other type of controlling circuitry) capable of accessing memory 1003. The system 1000 can include separate integrated circuits, or both the host 1002 and the memory device 1003 can be on the same integrated circuit. For example, the host 1002 may be a system controller of a memory system comprising multiple memory devices 1003, with the system controller 1005 providing access to the respective memory devices 1003 by another processing resource such as a central processing unit (CPU).

In the example shown in FIG. 10, the host 1002 is responsible for executing an operating system (OS) and/or various applications (e.g., processes) that can be loaded thereto (e.g., from memory device 1003 via controller 1005). The OS and/or various applications can be loaded from the memory device 1003 by providing access commands from the host 1002 to the memory device 1003 to access the data comprising the OS and/or the various applications. The host 1002 can also access data utilized by the OS and/or various applications by providing access commands to the memory device 1003 to retrieve said data utilized in the execution of the OS and/or the various applications.

For clarity, the system 1000 has been simplified to focus on features with particular relevance to the present disclosure. The memory array 1010 can be a DRAM array comprising at least one memory cell with conductive line contact regions having multiple multi-direction conductive lines and staircase conductive line contact structures formed according to the techniques described herein. For example, the memory array 1010 can be an unshielded DL 4F2 array such as a 3D-DRAM memory array. The array 1010 can include memory cells arranged in rows coupled by word lines (which may be referred to herein as access lines or select lines) and columns coupled by digit lines (which may be referred to herein as sense lines or data lines). Although a single array 1010 is shown in FIG. 1, embodiments are not so limited. For instance, memory device 1003 may include a number of arrays 1010 (e.g., a number of banks of DRAM cells).

The memory device 1003 includes address circuitry 1006 to latch address signals provided over an interface 1004. The interface can include, for example, a physical interface employing a suitable protocol (e.g., a data bus, an address bus, and a command bus, or a combined data/address/command bus). Such protocol may be custom or proprietary, or the interface 1004 may employ a standardized protocol, such as Peripheral Component Interconnect Express (PCIe), Gen-Z, CCIX, or the like. Address signals are received and decoded by a row decoder 1008 and a column decoder 1012 to access the memory array 1010. Data can be read from memory array 1010 by sensing voltage and/or current changes on the sense lines using sensing circuitry 1011. The sensing circuitry 1011 can comprise, for example, sense amplifiers that can read and latch a page (e.g., row) of data from the memory array 1010. The I/O circuitry 1007 can be used for bi-directional data communication with the host 1002 over the interface 1004. The read/write circuitry 1013 is used to write data to the memory array 1010 or read data from the memory array 1010. As an example, the circuitry 1013 can include various drivers, latch circuitry, etc.

Control circuitry 1005 decodes signals provided by the host 1002. The signals can be commands provided by the host 1002. These signals can include chip enable signals, write enable signals, and address latch signals that are used to control operations performed on the memory array 1010, including data read operations, data write operations, and data erase operations. In various embodiments, the control circuitry 1005 is responsible for executing instructions from the host 1002. The control circuitry 1005 can include a state machine, a sequencer, and/or some other type of control circuitry, which may be implemented in the form of hardware, firmware, or software, or any combination of the three. In some examples, the host 1002 can be a controller external to the memory device 1003. For example, the host 1002 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

As used herein, the term "secondary portion" may be used synonymously with the term "second portion", meaning a portion extending in a different direction than a "first portion" or "primary portion". For example, a first portion may extend in a first direction, and a number of secondary portions may extend in a second direction perpendicular to the first direction.

The terms "first portion" and "second portion" may be used herein to denote two portions of a single element. For example, a "first portion" of a digit line and a "second portion" of a digit line may denote two portions of a single digit line. It is not intended that the portions referred to as the "first" and/or "second" portions have some unique meaning. It is intended only that one of the "portions" extends in a different direction than another one of the "portions"

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device having arrays of vertically stacked memory cells, having multiple multi-direction conductive lines, comprising:
    a vertical stack of layers formed from repeating iterations of a group of layers,
    the group of layers comprising: a first dielectric material layer, a semiconductor material layer, and a second dielectric material layer, the second dielectric material layer having a conductive line formed in a horizontal plane therein; and
    the vertical stack of layers having multiple multi-direction conductive lines in an interconnection region with a first portion of the interconnection region formed in an array region and a second portion formed in a conductive line contact region that is spaced from the array region.

2. The memory device of claim 1, wherein the arrays of vertically stacked memory cells further comprises a number of horizontally oriented access devices, wherein each horizontally oriented access device is electrically coupled to a second portion of a conductive line of the vertical stack of horizontally oriented conductive lines at an end of the conductive line.

3. The memory device of claim 1, wherein the second portion of each conductive line is of a length greater than a length of the second portion of the conductive line oriented above it.

4. The memory device of claim 2, further comprising a vertical body contact formed in direct electrical contact with one or more of the number of horizontally oriented access devices.

5. The memory device of claim 2, wherein each of the number of horizontally oriented access devices is electrically coupled to the second portion of one of the conductive lines of the vertical stack of horizontally oriented conductive lines.

6. The memory device of claim 5, wherein each of the number of horizontally oriented access devices is electrically coupled to a sense amplifier.

7. The memory device of claim 1, wherein each conductive line comprises a first portion extending in a first horizontal direction, a second portion extending in a second horizontal direction at an angle to the first horizontal direction, and a third portion extending in the first horizontal direction.

8. The memory device of claim 1, wherein the memory device is a three-dimensional (3D) dynamic random access memory device.

9. The memory device of claim 2, further comprising a vertical body contact formed in direct, electrical contact with one or more of the number of horizontally oriented access devices.

10. The memory device of claim 9, wherein the vertical body contact is separated from the horizontally oriented conductive lines by a third dielectric.

11. The memory device of claim 10, further comprising horizontally oriented storage nodes comprising capacitor cells.

12. The memory device of claim 9, wherein the number of horizontally oriented access devices comprise transistor cells.

13. The memory device of claim 1, wherein the conductive line contact region has multiple multi-direction conductive lines each having first and second portions and wherein, the second portions are laterally spaced with respect to each other.

14. A method for forming arrays of vertically stacked memory cells, having multiple multi-direction conductive lines, comprising:
   forming a number of layers, in repeating iterations vertically to form a vertical stack, the layers comprising: a first dielectric material layer, a semiconductor material layer, and a second dielectric material layer having a conductive line formed in a horizontal plane therein;
   the second dielectric material layer having multiple multi-direction horizontal conductive lines has a first portion extending in a first horizontal direction and a second portion extending in a second horizontal direction at an angle to the first horizontal direction and wherein the second portions are laterally spaced with respect to each other to allow for vertical interconnections to be attached to the second portions;
   performing a removal process in repeating vertical iterations at an area that includes at least a section of the second portion of the conductive line to form a staircase contact structure, comprising:
   selectively removing a first portion of each layer of a first group of layers of the number of layers by removing the first portion of each layer of the first group of layers between a reference line and a first lateral distance from the reference line;
   selectively removing a portion of each layer of a second group of layers of the number of layers by removing the portion of each layer of the second group of layers between the reference line and a second distance back from the reference line; and
   selectively removing a second portion of each layer of the first group of layers of the number of layers by removing the second portion of each layer of the first group of layers between the reference line and a third distance back from the reference line and wherein the third distance is greater than the second distance.

15. The method of claim 14, wherein the first distance is equal in magnitude to the second distance.

16. The method of claim 14, further comprising wherein the multiple multi-direction conductive lines are located in an interconnection region with a first portion of the interconnection region formed in an array region and a second portion formed in a conductive line contact region that is spaced from the array region.

17. A memory device having arrays of vertically stacked memory cells, having multiple multi-direction conductive lines, comprising:
   a vertical stack of layers formed from repeating iterations of a group of layers,
   the group of layers comprising: a first dielectric material layer, a semiconductor material layer, and a second dielectric material layer, the second dielectric material layer having a conductive line formed in a horizontal plane therein; and
   the vertical stack of layers having multiple multi-direction horizontal conductive lines formed therein, wherein each of the horizontal conductive lines has a first portion extending in a first horizontal direction and a second portion extending in a second horizontal direction at an angle to the first horizontal direction and wherein the second portions are laterally spaced to allow for vertical interconnections to be attached to the second portions.

18. The memory device of claim 17, wherein one or more of the multi-direction horizontal conductive lines are horizontal digit lines.

19. The memory device of claim 17, further comprising a vertical body contact formed in direct electrical contact with one or more horizontally oriented access devices, wherein each of the one or more horizontally oriented access devices is coupled to a storage node.

20. The memory device of claim 17, wherein one or more of the multi-direction horizontal conductive lines are word lines.

21. The memory device of claim 17, wherein the arrays of vertically stacked memory cells are electrically coupled in an open digit line architecture.

22. The memory device of claim 17, wherein the arrays of vertically stacked memory cells are electrically coupled in a folded digit line architecture.

* * * * *